(12) United States Patent
McDonnell et al.

(10) Patent No.: US 9,119,326 B2
(45) Date of Patent: Aug. 25, 2015

(54) SYSTEM AND METHODS FOR COOLING ELECTRONIC EQUIPMENT

(75) Inventors: Gerald McDonnell, Poughquag, NY (US); Earl Keisling, Ridgefield, CT (US); John Costakis, Hyde Park, NY (US)

(73) Assignee: Inertech IP LLC, Danbury, CT (US)

( * ) Notice: Subject to any disclaimer, the term of this patent is extended or adjusted under 35 U.S.C. 154(b) by 81 days.

(21) Appl. No.: 13/821,623

(22) PCT Filed: May 14, 2012

(86) PCT No.: PCT/US2012/037858
§ 371 (c)(1),
(2), (4) Date: Jun. 25, 2013

(87) PCT Pub. No.: WO2012/158653
PCT Pub. Date: Nov. 22, 2012

(65) Prior Publication Data
US 2014/0311169 A1    Oct. 23, 2014

Related U.S. Application Data

(60) Provisional application No. 61/486,049, filed on May 13, 2011.

(51) Int. Cl.
*H05K 7/20* (2006.01)
*F25B 31/00* (2006.01)

(52) U.S. Cl.
CPC ............ *H05K 7/2029* (2013.01); *F25B 31/006* (2013.01); *H05K 7/20745* (2013.01);
(Continued)

(58) Field of Classification Search
CPC ............ F25B 31/006; F25B 2600/021; H05K 7/20827; H05K 7/20745; H05K 7/2029; Y10T 29/49359; Y02B 30/741

USPC ............... 62/62, 259.2, 228.1, 229, 333, 185, 62/201, DIG. 22; 165/104.33, 104.31; 361/699, 679.46; 29/890.035
See application file for complete search history.

(56) References Cited

U.S. PATENT DOCUMENTS 5,475,986 A * 12/1995 Bahel et al. ...................... 62/160
6,832,489 B2 * 12/2004 Bash et al. ....................... 62/180
(Continued)

FOREIGN PATENT DOCUMENTS

JP        2009-216295 A     9/2009

OTHER PUBLICATIONS

International Search Report for corresponding application No. PCT/US2012/037858 mailed Nov. 20, 2012.
(Continued)

*Primary Examiner* — Mohammad M Ali
(74) *Attorney, Agent, or Firm* — Cater, DeLuca, Farrell & Schmidt, LLP

(57) ABSTRACT

Systems and methods for cooling an inverter of a variable frequency drive that drives a compressor in a cooling system for electronic equipment are disclosed. The system includes a first fluid circuit that cools electronic equipment using a first fluid flowing therethrough and a second fluid circuit that free cools a second fluid flowing therethrough. The second fluid circuit cools the first fluid using the free-cooled second fluid. The system further includes a third fluid circuit that mechanically cools the second fluid using a third fluid flowing therethrough as a function of the wet bulb temperature of atmospheric air. The third fluid circuit includes at least one compressor compresses the third fluid and is driven by a motor coupled to the variable frequency drive. At least a portion of the first fluid flowing through the third fluid circuit is diverted to cool the inverter of the variable frequency drive.

20 Claims, 20 Drawing Sheets

(52) U.S. Cl.
CPC ....... *H05K7/20827* (2013.01); *F25B 2600/021* (2013.01); *Y02B 30/741* (2013.01); *Y10T 29/49359* (2015.01)

(56) References Cited

U.S. PATENT DOCUMENTS

| | | | | |
|---|---|---|---|---|
| 6,854,287 | B2 * | 2/2005 | Patel et al. | 62/259.2 |
| 2003/0000230 | A1 * | 1/2003 | Kopko | 62/82 |
| 2004/0237554 | A1 | 12/2004 | Stark et al. | |
| 2006/0199051 | A1 * | 9/2006 | Bai et al. | 429/17 |
| 2008/0174393 | A1 * | 7/2008 | Schnetzka et al. | 336/57 |
| 2008/0204999 | A1 * | 8/2008 | Clidaras et al. | 361/696 |
| 2009/0210096 | A1 * | 8/2009 | Stack et al. | 700/278 |
| 2010/0076607 | A1 * | 3/2010 | Ahmed et al. | 700/276 |
| 2010/0297927 | A1 * | 11/2010 | Nagamatsu et al. | 454/256 |
| 2010/0307171 | A1 * | 12/2010 | Hamann et al. | 62/77 |
| 2011/0100045 | A1 | 5/2011 | Carlson | |

OTHER PUBLICATIONS

International Preliminary Report on Patentability and Writtten Opinion for corresponding application No. PCT/US2012/037858 mailed Nov. 19, 2013.

* cited by examiner

DETAIL 7A

SYSTEM AND METHODS FOR COOLING ELECTRONIC EQUIPMENT

CROSS REFERENCE TO RELATED APPLICATIONS

This application is a national phase of International Application No. PCT/US2012/037858 filed on May 14, 2012 and claims the benefit of, and priority to, U.S. Provisional Application No. 61/486,049, which was filed on May 13, 2011, the entire contents of each of which are incorporated by reference herein.

BACKGROUND

1. Technical Field

The present disclosure generally relates to cooling systems for electronic equipment. More particularly, the present disclosure relates to systems and methods for cooling inverters of variable frequency drives in cooling systems for electronic equipment.

2. Background of Related Art

Compressors are deployed for many air conditioning and refrigeration systems including for commercial and industrial cooling for human comfort and refrigeration applications including systems for cooling data centers. Compressors using modern-day inverters (e.g., motor speed controllers or variable speed drives) require very tight temperature and humidity control. Inverters have been adopted on many compressor systems in order to gain greater efficiencies. As with any electrical motor controller, the inverter generates a certain amount of heat. This heat output varies based on the efficiency of the inverter and the compressor motor and the amount of load on the motor.

To ensure safe operation of the inverter, the temperature and humidity of the environment surrounding the inverter must be carefully measured and controlled. For this reason, many chiller manufacturers provide their own internal cooling systems to protect their compressor motor inverter. By doing this, they do not rely strictly on cool environments being maintained within a chiller or mechanical equipment room.

Many such inverter cooling systems are fed from systems that are served by the chiller or compressor. For example, a cooling system for a particular chiller inverter may be fed from the condenser water that is part of the chiller system. As another example, other equipment manufacturers may cool their inverters with the refrigerant that is part of the base system cycle within the chiller. Each of these examples requires condenser water or refrigerant to be pumped through the inverter's heat exchanger (extractor) to keep the inverter cool.

Various manufacturers of compressors and chillers have experienced many problems with maintaining tight control of this cooling process because of the variables associated with the cooling media, as well as the environmental variables or conditions of the space in which the inverter operates. The variables of the cooling media include the range of temperature of the cooling media. The temperature and other variables of the condenser water and chiller refrigerants vary greatly throughout the various weather and operating conditions.

The environmental variables include ambient temperature and relative humidity. Most chillers and compressors operate in non-conditioned spaces similar to central chiller plants and mechanical equipment rooms. These spaces are rarely cooled and the humidity within these spaces is rarely controlled. The confluence of these two influences—media temperature and environmental conditions—presents certain challenges. The heat output of the compressor inverter increases as the load of the motor increases. As such, the cooling fluid provided to the inverter needs to be regulated based on the heat load output of the motor because the fluid cooling media is subject to temperature fluctuations. In particular, the amount of cooling fluid must be regulated to the amount of heat that must be rejected.

It is this tight control issue that has stymied many manufacturers and presented problems with safety and limit controls that need to be employed in order to protect the equipment during less than advantageous operating conditions. Many of these safety and limit measures are naturally designed to protect the equipment from operating problems or losses in operation altogether.

In order to maximize the prime function of the safety and protection circuits, the chiller and compressor manufacturers have purposely designed highly reliable shut down and limiting features into the protection systems. The problem with these systems, however, is that they are inherently inefficient systems. They are designed to operate the chiller and compressor motor inverters over a wide range of fluid and temperature conditions. In addition, they limit and/or prevent operation of the motors at higher performance conditions if those conditions create a situation where the inverter could potentially be damaged or fail due to the influence of the outside variables.

For example, the cold condenser water would be limited or prevented from entering the inverter when the environment in the chiller plant is humid. This could create condensation, which could potentially damage the inverter or create a "short circuit" or grounding problem. To avert these problems, chillers or compressors include dew point safety sensors that sense harmful levels of condensation and safety limit devices that reduce the amount of cooling water supplied to the inverter if the dew point safety sensors sense harmful levels of condensation. As a result, the inverter would heat up and the inverter's heat sensors would cause the motor output to slow down or stop altogether.

These safety and limiting features protect the motor inverter, but they also limit the chiller output capacity at a critical point in the chiller efficiency operating curve. This means that the compressor cannot continue to operate or operate at higher capacity at the most opportune operating condition for the chiller. These safety and limiting features severely impede the compressor from operating over a greater span of water, refrigerant, and ambient temperatures. As a result, the compressors are forced to operate at reduced capacities under many conditions and there is an overall reduction in potential kW/ton output over a broad spectrum of environmental conditions. The safety and limiting features also severely limit a chiller's ability to enter into and out of free cooling in a seamless manner. Thus, the safety and limiting features prevent the overall system from functioning seamlessly and at a point when it could be the most beneficial from an energy standpoint.

Compressor manufacturers rate their compressors based on the minimum work load with which they should safely be operated. This is to protect the equipment. This rating is the "lift" of a compressor. The industry standard is currently maintained at approximately 1.5 or above. The rating is a calculation that utilizes the following important information. A set point or standard has been established to maintain a minimum relation between the high and the low system pressure. Because inverters are capable of lowering the speed of the compressor thereby enabling lower operating ranges for the equipment, an industry minimum was established to effectively protect the inverter from operational problems at the low end of the operating parameter. Specifically, the low end of the system is usually related to free cooling and low condenser water conditions. This was mainly due to a concern for condensate and the resultant damage that could occur. As a result of this minimum lift condition to prevent condensation problems, the 1.5 lift has been established as the industry low end safe number.

SUMMARY

The systems and methods according to the present disclosure utilize stable temperate-pumped cooling fluid from an external source (independent circuit) to cool the compressor motor inverters on either single compressors or chiller compressors that are operating on another independent circuit. The systems and methods according to the present disclosure could be modified to be used on many complementary systems that utilize a relatively stable or closer tolerance pumped fluid, e.g., water or refrigerant, to be pumped to cool a fluctuating compressed circuit inverter. The systems and methods according to the present disclosure not only may enable the safety "span" or limiting parameters of the compressors to be reduced, but also may remove the need for other limiting sensors that are typically included on the systems as protective devices.

The data center IT cooling industry has adopted the use of pumped refrigerant as a means to cool many data centers. As a result, there are pumped refrigerant systems that deliver temperate liquid refrigerant to the evaporator side (or load side) of the system in close proximity to compressed refrigeration circuits that are on the heat rejection side of the system. The systems and methods according to the present disclosure utilize a small portion of pumped refrigerant from the liquid system and deliver it in close temperature and flow rates to the motor inverter on the compressed cooling circuits. By utilizing this fluid, which would not normally be used for this purpose, the systems and methods according to the present disclosure are able to provide the inverter a stable temperate flow in very close tolerances. The ability to provide the inverter with such close tolerance "optimum" fluid temperatures enables the compressor manufacturer to remove many of the "limiting" safety parameters that have been included both in the software as well in some cases hardwired limiting devices with restrictive set points.

In one aspect, the present disclosure features a system for cooling an inverter of a variable frequency drive. The system includes a first fluid circuit, a second fluid circuit, and a third fluid circuit. The first fluid circuit cools electronic equipment using a first fluid flowing through the first fluid circuit. The second fluid circuit free cools a second fluid flowing through the second fluid circuit. The second fluid circuit also cools the first fluid using the free-cooled second fluid.

The third fluid circuit mechanically cools the second fluid using a third fluid flowing through the third fluid circuit as a function of the difference between the wet bulb temperature of atmospheric air and a first predetermined wet bulb temperature, when the wet bulb temperature exceeds the first predetermined wet bulb temperature. The third fluid circuit includes at least one compressor that compresses the third fluid. The at least one compressor is driven by a motor coupled to the variable frequency drive. At least a portion of the first fluid flowing through the first fluid circuit is diverted to cool the inverter of the variable frequency drive.

At least a portion of the first fluid cooling the inverter of the variable frequency drive may be returned such that the at least a portion of the first fluid is in thermal communication with the second fluid flowing through the second fluid circuit.

The first fluid circuit may include a fluid receiver and the system may further include a sensor and a fourth fluid circuit. The sensor senses the liquid level of the first fluid contained in the fluid receiver. The fourth fluid circuit is in thermal communication with the first fluid contained in the fluid receiver. The fourth fluid circuit mechanically cools and condenses the first fluid when the sensed liquid level falls below a predetermined liquid level.

In some embodiments, the first fluid and the third fluid include a refrigerant and the second fluid includes water. In some embodiments, the third fluid circuit is closely coupled to the electronic equipment.

In another aspect, the present disclosure features a system for cooling electronic equipment. The system includes a free-cooling system, a mechanical sub-cooling system, and a variable frequency drive cooling system. The free-cooling system cools a first fluid that is in thermal communication with electronic equipment using atmospheric air. The free-cooling system includes a free-cooling device and a main heat exchanger. The free-cooling device cools a second fluid using atmospheric air. The main heat exchanger is in fluid communication with the free-cooling device and enables heat transfer from the first fluid to the second fluid.

The mechanical sub-cooling system is coupled to the free-cooling system. The mechanical sub-cooling system cools a second fluid flowing in the free-cooling system as a function of an amount by which the free-cooling system has exceeded a predetermined cooling capacity. The mechanical sub-cooling system includes a first heat exchanger, a compressor subassembly, and a second heat exchanger. The first heat exchanger enables heat transfer from the second fluid flowing into the main heat exchanger to a third fluid flowing through the first heat exchanger. The compressor subassembly includes a compressor that is in fluid communication with the first heat exchanger and compresses the third fluid flowing out of the first heat exchanger. The compressor subassembly further includes a motor that drives the compressor and a variable frequency drive that drives the motor. The second heat exchanger is in fluid communication with the compressor and enables heat transfer from the compressed third fluid to the second fluid flowing out of the main heat exchanger.

The variable frequency drive cooling system cools the variable frequency drive using at least a portion of the free-cooled first fluid.

In yet another aspect, the present disclosure features a method of assembling a system for cooling electronic equipment. The method includes coupling a first fluid circuit that is in thermal communication with electronic equipment to a first fluid path through a first heat exchanger and coupling a second fluid circuit that is in thermal communication with atmospheric air to a second fluid path through the first heat exchanger to enable heat transfer from the first fluid circuit to the second fluid circuit. The method further includes coupling a first fluid path through a second heat exchanger to an output of the second fluid path through the first heat exchanger and coupling a first fluid path through a third heat exchanger to an input of the first fluid path through the first heat exchanger.

The method further includes coupling in series a second fluid path through the second heat exchanger and a second fluid path through the third heat exchanger and coupling a compressor in the second fluid path through the third heat exchanger to the second fluid path through the second heat exchanger to form a third fluid circuit. The method further includes coupling a heat exchanger of an inverter of a variable frequency drive that drives the compressor to the first fluid circuit to cool the heat exchanger of the inverter via the first fluid circuit. In some embodiments, the method further includes coupling the inverter heat exchanger to the third fluid circuit.

In yet another aspect, the present disclosure features a system for cooling electronic equipment. The system includes a first fluid circuit and a second fluid circuit. The first fluid circuit is in thermal communication with electronic equipment and is coupled to a first fluid path through a first heat exchanger. The second fluid circuit is in thermal communication with atmospheric air and is coupled to a second fluid path through the first heat exchanger to enable heat transfer from the first fluid circuit to the second fluid circuit. The system further includes a second heat exchanger, a third heat exchanger, and a compressor fluidly coupled together to form a third fluid circuit. The second heat exchanger includes a first fluid path coupled to an output of the second fluid path through the first heat exchanger. The third heat exchanger includes a first fluid path coupled to an input of the first fluid path through the first heat exchanger. A second fluid path through the second heat exchanger is coupled in series to a second fluid path through the third heat exchanger. The system further includes a compressor fluidly coupled between the second fluid path through the third heat exchanger and the second fluid path through the second heat exchanger.

In some embodiments, the system further includes a heat exchanger of an inverter of a variable frequency drive that drives the compressor. The inverter heat exchanger is in fluid communication with the first fluid circuit to cool the inverter heat exchanger of the inverter via the first fluid circuit.

In yet another aspect, the present disclosure features a method of cooling electronic equipment. The method includes cooling electronic equipment using a first fluid and free cooling the first fluid by enabling heat transfer from the first fluid to a second fluid that has been cooled using atmospheric air. The method further includes mechanically cooling the second fluid. Mechanically cooling the second fluid includes cooling the second fluid before using the second fluid to free cool the first fluid by enabling heat transfer from the second fluid to a third fluid. Mechanically cooling the second fluid further includes compressing the third fluid using a compressor that is driven by a variable frequency drive and condensing the compressed third fluid by enabling heat transfer from the compressed third fluid to the second fluid after using the second fluid to free cool the first fluid. Mechanically cooling the second fluid further includes reducing the pressure of the condensed third fluid to reduce the temperature of the second fluid. The method further includes diverting at least a portion of the first fluid to enable heat transfer from the inverter of the variable frequency drive to the first fluid.

In some embodiments, the method may further include returning the at least a portion of the first fluid cooling the inverter of the variable frequency drive to thermal communication with the second fluid circuit configured to free cool the second fluid flowing through the second fluid circuit.

In some embodiments, mechanically cooling the second fluid includes mechanically cooling the second fluid to the extent that free cooling the first fluid is insufficient to cool the first fluid. In other embodiments, mechanically cooling the second fluid includes mechanically cooling the second fluid as a function of the temperature of the first fluid or the wet bulb temperature of atmospheric air.

In some embodiments, the method further includes sensing a wet bulb temperature of the atmospheric air and varying the speed of the compressor compressing the third fluid as a function of the sensed wet bulb temperature to vary the temperature of the second fluid.

In some embodiments, the method further includes receiving the free-cooled first fluid in a fluid receiver, sensing the liquid level of the first fluid contained in the fluid receiver, mechanically cooling the first fluid to condense the first fluid when the sensed liquid level falls below a first predetermined liquid level, and deactivating mechanical cooling when the sensed liquid level reaches a second predetermined liquid level higher than the first predetermined liquid level.

In some embodiments, mechanically cooling the first fluid includes cooling the first fluid in the fluid receiver by enabling heat transfer from the first fluid in the fluid receiver to a third fluid, compressing the third fluid, condensing the compressed third fluid by enabling heat transfer from the compressed third fluid to the second fluid that has been cooled using atmospheric air, and reducing the pressure of the condensed third fluid to reduce the temperature of the third fluid.

The first fluid and the third fluid may contain a refrigerant and the second fluid may contain water. The refrigerant may be R134A and the second fluid may be condenser water, chilled water, or a glycol solution.

In some embodiments, the method further includes sensing the temperature of the free-cooled first fluid and regulating the flow rate of the second fluid as a function of the temperature of the free-cooled first fluid.

In yet another aspect, the present disclosure features a method of cooling data center equipment. The method includes cooling electronic equipment using a first fluid, free cooling a second fluid that is in thermal communication with the first fluid, mechanically cooling the second fluid using a third fluid as function of the wet bulb temperature, diverting a portion of the first fluid flowing to the electronic equipment to cool an inverter of a variable frequency drive that drives a compressor for compressing the third fluid, and returning the portion of the first fluid cooling the inverter of the variable frequency drive to the first fluid that has been used to cool electronic equipment.

BRIEF DESCRIPTION OF THE DRAWINGS

Various embodiments of the present disclosure are described with reference to the accompanying drawings wherein.

DETAILED DESCRIPTION

Figure 1:
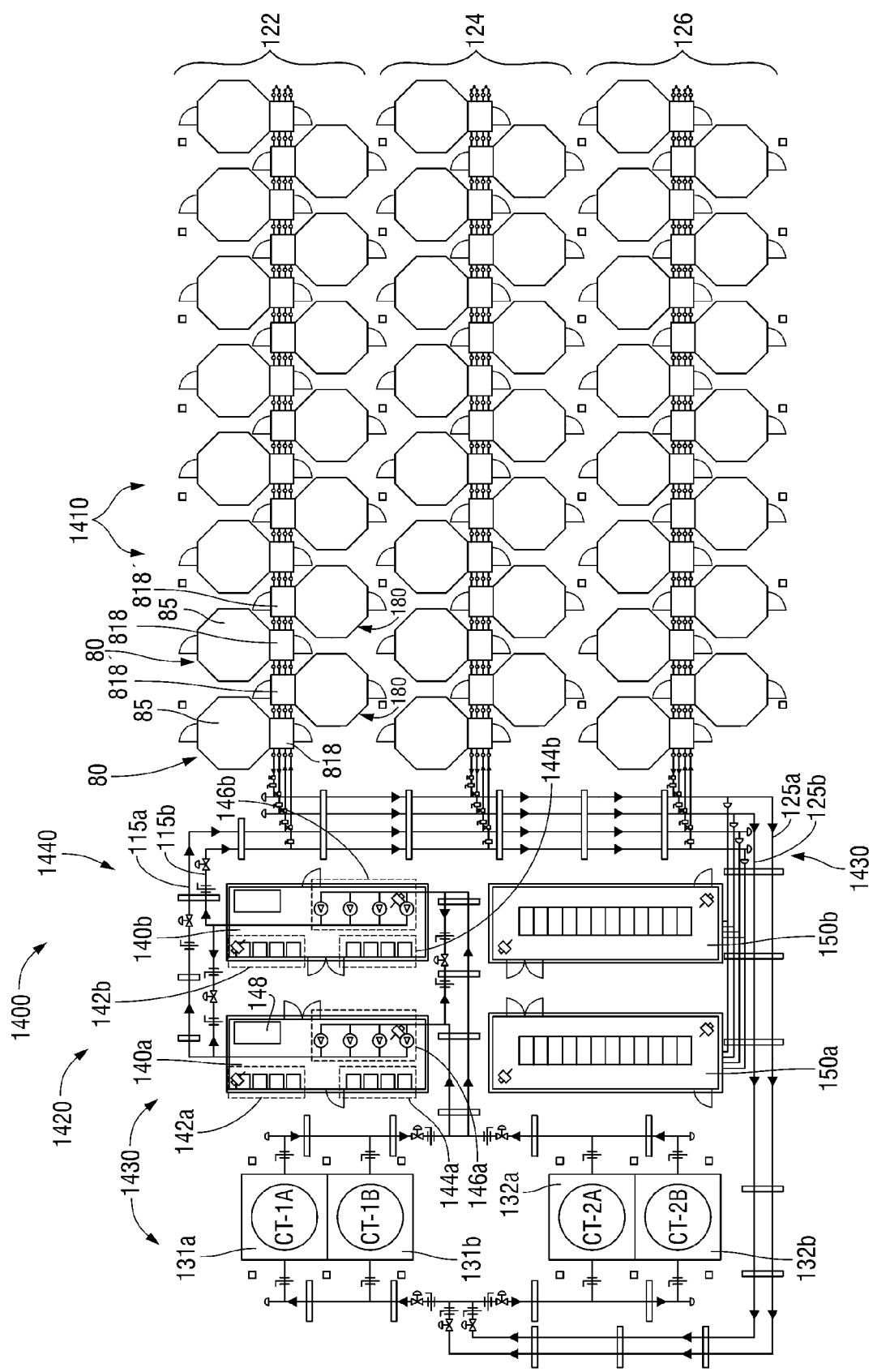
FIG. 1 is a schematic diagram of a modular data center according to embodiments of the present disclosure.

Embodiments of the presently disclosed close-coupled cooling systems and methods will now be described in detail with reference to the drawings, in which like reference numerals designate identical or corresponding elements in each of the several views.

The present disclosure relates to modular data pods and related support systems for providing energy-efficient, space-saving, and high-density server rack configurations. This modular approach allows for highly efficient use of geometric shapes such as octagonal, hexagonal, and pentagonal shapes for creating a hot aisle and a cold aisle through which air circulates for cooling the server racks. These polygonal shapes allow for maximum energy-efficiency and space-savings using the benefits of both the interior and the exterior angles and sides. The interior pod shape provides a natural circular configuration for positioning server racks. As compared to the prior art, this configuration provides a more efficient way to create and contain a hot aisle and a cold aisle.

The cooling air, which is used to efficiently cool computer systems, such as data servers, follows a natural path which allows for natural convection. The natural convection is assisted by mechanical cooling systems and components, e.g., fans, which are deployed in an efficient manner. The exterior shape of the modular data pods allows for the most efficient use of the space-saving characteristics of the multi-sided and angular geometric shapes of the modular data pods. The modular data pods can be deployed in tight groups similar to the patterns seen in bee hives. Bee hives are considered to be the most efficient use of space known to man. The space-saving, efficient design of the modular data pods accommodates the tremendous growth of the IT data storage industry. The completely modularized data pods also feature energy-efficient cooling systems and electrical, control, and IT systems for "just in time" deployment.

The close-coupled cooling systems and methods according to some embodiments of the present disclosure are "chiller-less" and require significantly less mechanical refrigeration capacity than cooling systems using chillers to handle the cooling of fluctuating IT loads. In some embodiments, the system uses approximately 140 kW of subcooling to accomplish the cooling of 1 megawatt of IT loading. This is based on providing cooling in areas of relatively high wet-bulb conditions such as the north east or southern hemispheres where wet-bulb conditions can be extreme (e.g., wet-bulb temperatures of 78° F. and above). The system can be deployed in relatively high wet-bulb environmental areas where chillers or direct expansion (DX) systems would have been normally been mandatory.

An individual subcooling system can operate with close-coupled cooling at the individual point of loading to enable sufficient cooling to support IT rack inlet cooling temperatures (at the cold aisle) that would have normally required either DX or chiller assistance. The system according to some embodiments of the present disclosure is used in close-coupled applications such as modular data center applications. In other embodiments, the cooling system can be used as a packaged system to support modular cooling within a typical data center white space. The system can significantly reduce the up front as well as the operational costs (e.g., energy costs) of data centers.

In some embodiments, the system can cool IT server racks using 72° F. refrigerant or higher as dictated by a particular project. This provides cold aisle air temperatures or rack inlet temperatures of 75° F. or higher as dictated by a particular project.

FIG. 1 is a schematic diagram of a data pod farm or modular data center 1400. The data pod farm 1400 includes a data pod hive 1410. The term "hive" refers to a plurality of modular data pods coupled together and the associated cooling infrastructure. The data pod hive 1410 includes a plurality of modular data pods 80 and 180 arranged in data pod chains 122, 124, 126. The modular data pods 80 and 180 include a data enclosure 85, which contains server racks, and an auxiliary enclosure 818, which contains cooling, power, and control circuitry.

The data pods 80 and 180 are coupled to a central cooling system 1420 that includes central cooling, power, and control systems. The central cooling system 1420 may form part of a Building Management System (BMS). The central cooling system 1420 includes a central cooling fluid circuit 1430. The central cooling fluid circuit 1430 includes a first pair of cooling towers 131a, 131b (also designated as CT-1A, CT-1B, respectively), a second pair of cooling towers 132a, 132b (also designated as CT-2A, CT-2B, respectively), two banks of fluid pumps 146a, 146b, a pair of supply lines 115a, 115b, and a pair of return lines 125a, 125b.

The central cooling system 1420 also includes two banks of variable frequency drives 144a, 144b, which drive respective banks of fluid pumps 146a, 146b. The central cooling system 1420 also includes two banks of variable frequency drives 142a, 142b, which drive fans and/or fluid pumps within the two pairs of cooling towers 131a, 131b, 132a, 132b. The data pod farm 1400 also includes a pair of central battery backup units 150a, 150b that provide battery backup power to the modular data pods 80.

The data pod farm or modular data center 1400 and modular data pod hive 1410 of FIG. 1 may be designed and deployed to support a large amount of server rack capacity (e.g., approximately 12-15 MW of server rack capacity). FIG. 1 shows the space-saving attributes of the modular data pods' geometric shape. A typical data center, which is non-modular, requires three to four times as much space to handle this level of server rack capacity and density.

The system infrastructure (the central cooling system 1420 and central cooling fluid circuit 1430) is located at one end 1440 of the data pod hive 1410 of the data pod farm 1400. FIG. 1 depicts an example of a full-hive deployment. Initially, however, a sufficient number of data pods 80 and 180 can be installed for early deployment. The number of cooling towers, pumps, and electrical switch equipment can be deployed as needed on a just-in-time basis. Additional modular data pods 80 and 180, including their auxiliary enclosures 818 and 818', respectively, housing associated pipe and electrical chases, can also be deployed as needed on a just-in-time basis. The installation of additional modular data pods 80 and 180 and associated auxiliary enclosures 818 and 818', respectively, at an earlier stage of deployment of the data pod farm 1400 is described below with respect to FIGS. 17, 17A, and 17B FIGS. 2A-2G depict modular data pods having different polygonal shapes according to embodiments of the present disclosure. The polygonal shapes of the modular data pods offer several benefits. The exterior of the polygonal shapes is conducive to space-efficient packing or grouping. And the interior of the polygonal shapes allows for tight arrangement of square or rectangular server racks corner to corner in a circular pattern within the polygonal shape of the modular data pod.

This arrangement defines an efficient partition between the hot and cold aisles. For example, in those embodiments where the computer racks are arranged so that they radiate or blow heat towards the walls of the data pod, the hot aisle is defined by the air space between the walls of the modular data pod and the computer racks and the cold aisle is defined by the air space created by the sides of the computer racks that face towards the center of the modular data pod. In other embodiments, the computer racks may be arranged so that the cold aisle is defined by the air space between the walls of the modular data pod and the computer racks and the hot aisle is defined by the air space created in the middle of the modular data pod by the sides of the computer racks that face towards the center of the modular data pod.

The tight grouping of the computer racks also allows for efficient use of the close distance between related equipment that is mounted in the computer racks. The result is efficient partitioning of hot and cold aisles, close grouping (i.e., space savings), and close distances between computer systems for electrical, mechanical, and IT interconnections and treatments.

Figure 2B:
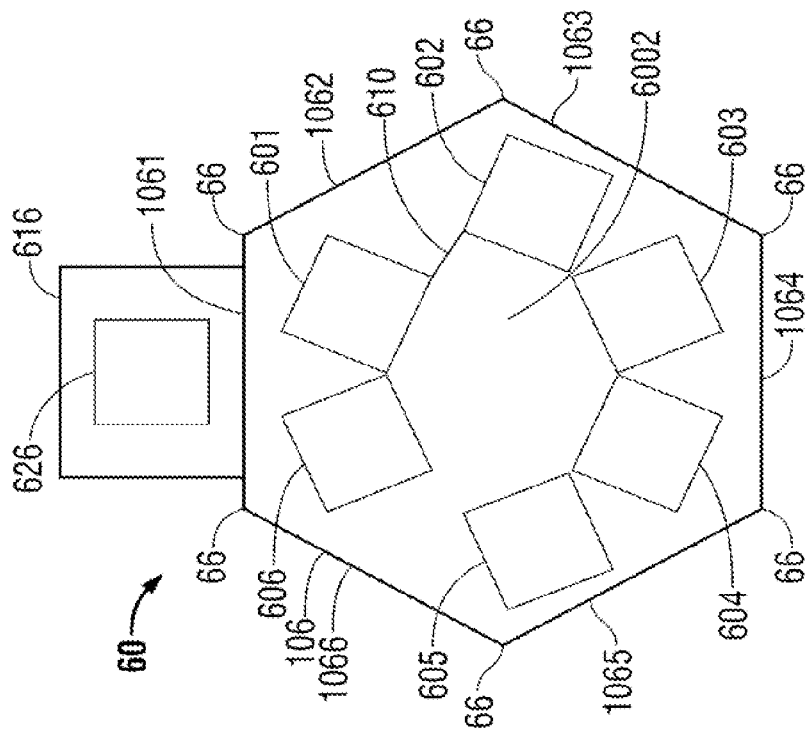
FIG. 2B is an illustration of a modular data pod having a hexagonal wall configuration according to another embodiment of the present disclosure.
Figure 2A:
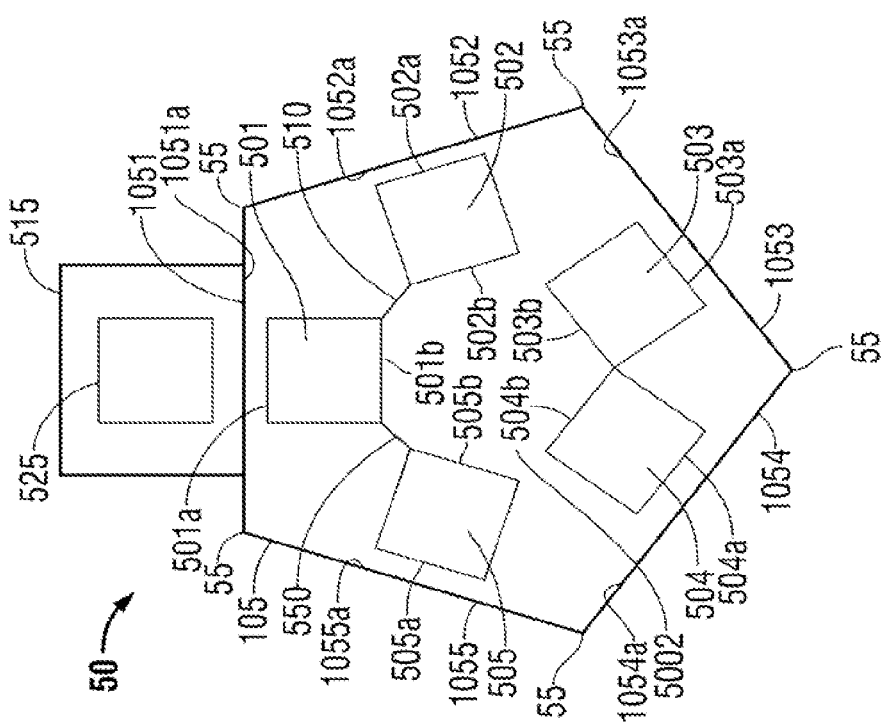
FIG. 2A is an illustration of a modular data pod having a pentagonal wall configuration according to one embodiment of the present disclosure.
Figure 2D:
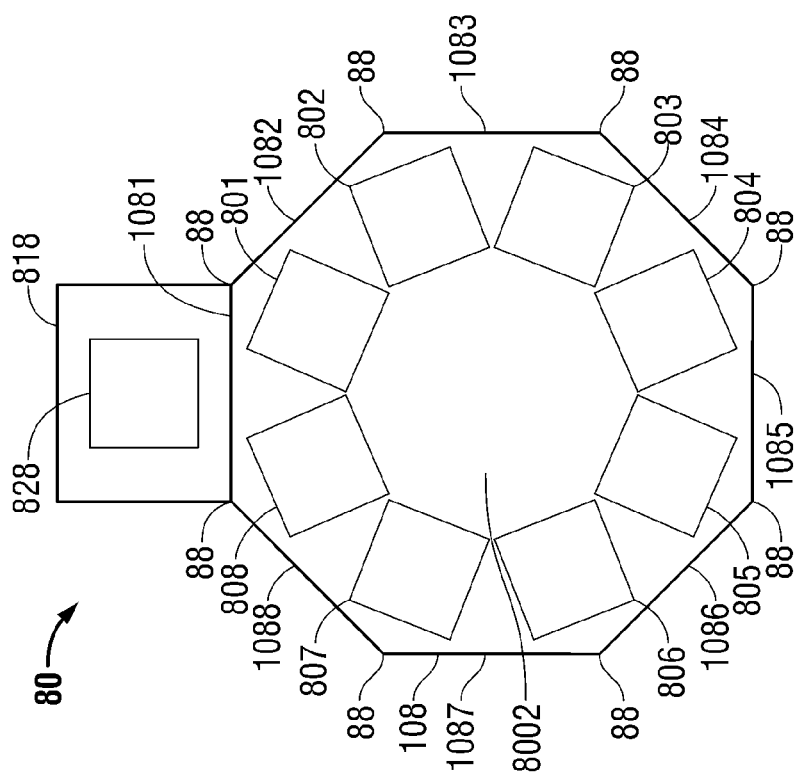
FIG. 2D is an illustration of a modular data pod having an octagonal wall configuration according to yet another embodiment of the present disclosure.
Figure 2C:
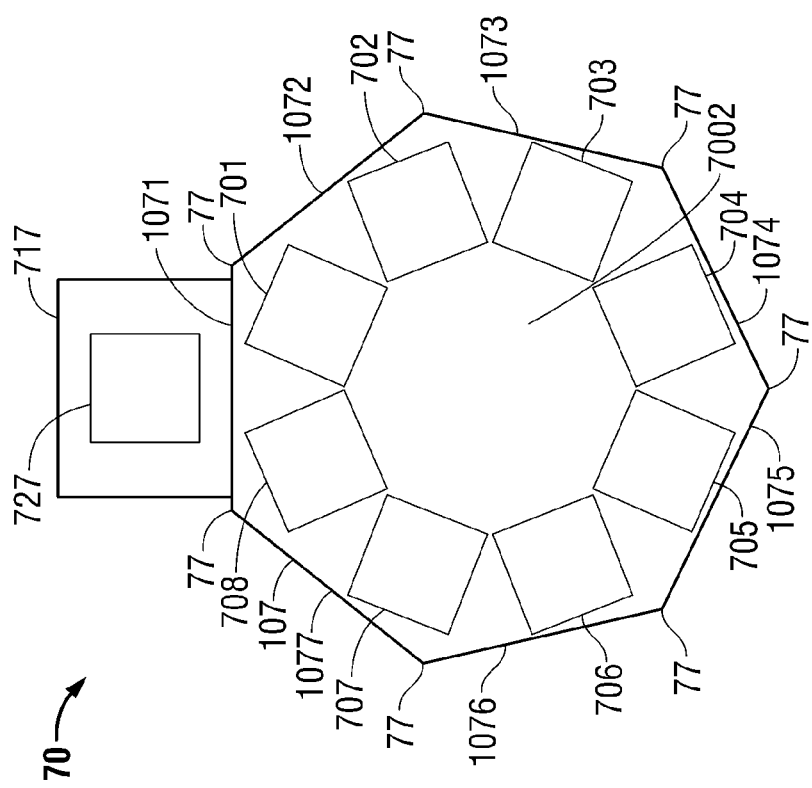
FIG. 2C is an illustration of a modular data pod having a heptagonal wall configuration according to yet another embodiment of the present disclosure.
Figure 2F:
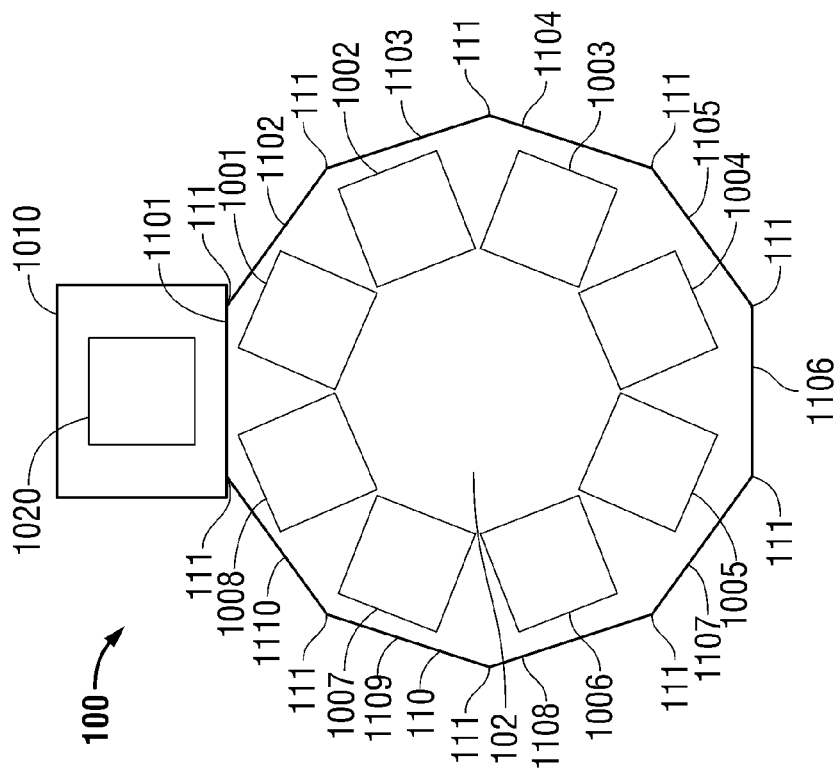
FIG. 2F is an illustration of a modular data pod having a decagonal wall configuration according to yet another embodiment of the present disclosure.

As shown in FIGS. 2A-2G, the walls of the modular data pod may be arranged in a variety of different polygonal shapes including a pentagon (e.g., the modular data pod 50 of FIG. 2A), hexagon (e.g., the modular data pod 60 of FIG. 2B), heptagon (e.g., the modular data pod 70 of FIG. 2C), octagon (e.g., the modular data pod 80 of FIG. 2D), nonagon (e.g., the modular data pod 90 of FIG. 2E), and decagon (e.g., the modular data pod 100 of FIG. 2F). These shapes can also be modified. For example, the octagonal-shaped modular data pod 80 of FIG. 2D can be stretched in one direction to increase the length of two walls of the modular data pod to form the modular data pod 80' of FIG. 2G.

In one embodiment of the present disclosure illustrated in FIG. 2A, modular pentagonal data pod 50 includes a data enclosure 105 including five external wall members 1051, 1052, 1053, 1054, and 1055 that are contiguously joined to one another along at least one edge. For example, edges 55 contiguously join external wall member 1051 to wall member 1052, external wall member 1052 to external wall member 1053, external wall member 1053 to external wall member 1054, external wall member 1054 to external wall member 1055, and external wall member 1055 to external wall member 1051, in the shape of a polygon.

The pentagonal modular data pod 50 includes server rack 501 positioned internally in the modular data pod 50 in proximity to external wall member 1051, server rack 502 positioned internally in the modular data pod 50 in proximity to external wall member 1052, server rack 503 positioned internally in the modular data pod 50 in proximity to external wall member 1053, server rack 504 positioned internally in the modular data pod 50 in proximity to external wall member 1054, and server rack 505 positioned internally in the modular data pod 50 in proximity to external wall member 1055.

To define a heat exchange volume 5002 substantially within a central region of the modular data pod 50, server racks 501 and 505, which are illustrated as being spaced apart from one another, may be contiguously joined together via internal wall member 550. Similarly, server racks 501 and 502, which are illustrated as being spaced apart from one another, may be contiguously joined together via internal wall member 510. (As defined herein, an internal wall member is a wall member disposed within the confines of each individual modular data pod defined by the external wall members).

Although server racks 502 and 503 and server racks 504 and 505 are also illustrated as being spaced apart from one another, those skilled in the art will recognize that internal wall members similar to internal wall members 510 and 550 may be disposed to contiguously join server racks 502 and 503 or server racks 504 and 505. Additionally, those skilled in the art will also recognize that the first heat exchange volume 5001 need not be tightly confined at each and every position between adjacent server racks to create suitable heat transfer conditions within the modular data pod 50.

The modular data pod 50 also includes an auxiliary enclosure 515 adjacent to external wall member 1051. In other embodiments, the auxiliary enclosure 515 may be adjacent to one of the external wall members 1051 to 1055. The auxiliary enclosure 515 includes a close-coupled dedicated cooling system 525 for chiller-less operation in high wet-bulb temperature applications, which is further described in detail below with respect to FIGS. 3, 4, and 5.

In one embodiment of the present disclosure as illustrated in FIG. 2B, a modular hexagonal data pod 60 includes an enclosure 106 having six external wall members 1061, 1062, 1063, 1064, 1065, and 1066 that are contiguously joined to one another along at least one edge in the shape of a polygon.

The hexagonal modular data pod 60 includes server rack 601 positioned internally in the modular data pod 60 in proximity to both external wall member 1061 and external wall member 1062, server rack 602 positioned internally in the modular data pod 60 in proximity to external wall member 1063, server rack 603 positioned internally in the modular data pod 60 in proximity to both external wall member 1063 and external wall member 1064, server rack 604 positioned internally in the modular data pod 60 in proximity to both external wall member 1064 and external wall member 1065, server rack 605 positioned internally in the modular data pod 60 in proximity to external wall member 1065, and server rack 606 positioned internally in the modular data pod 60 in proximity to both external wall member 1066 and external wall member 1061.

In a similar manner as described above with respect to modular data pod 50, to define a heat exchange volume 6002 substantially within a central region of the modular data pod 60, in one embodiment, the server racks 601 and 602, which are illustrated as being spaced apart from one another, may be contiguously joined together via an internal wall member 610 between the server racks 601 and 602. Again, although the server racks 605 and 606 are illustrated as being spaced apart from one another, those skilled in the art will recognize that internal wall members similar to internal wall member 610 may be disposed to contiguously join the corresponding server racks 605 and 606. Again, those skilled in the art will also recognize that the first heat exchange volume 6001 need not be tightly confined at each and every position between adjacent server racks in order for proper intended heat transfer conditions to occur within the modular data pod 60.

The modular data pod 60 also includes an auxiliary enclosure or compartment 616 adjacent to one of the external wall members 1061 to 1066, with the auxiliary enclosure 616 illustrated as being adjacent to external wall member 1061. Again, the auxiliary enclosure 616 includes a close-coupled dedicated cooling system 626 for operation in high wet-bulb temperature applications, which is described in detail below with respect to FIGS. 3, 4 and 5. In some embodiments, the close-coupled dedicated cooling system 626 may allow for chillerless operation in high wet-bulb temperature applications.

In another embodiment of the present disclosure as illustrated in FIG. 2C, a modular heptagonal data pod 70 includes an enclosure 107 including seven external wall members 1071, 1072, 1073, 1074, 1075, 1076, and 1077 that are contiguously joined to one another along at least one edge in the shape of a polygon.

The heptagonal modular data pod 70 includes server rack 701 positioned internally in the modular data pod 70 in proximity to both external wall member 1071 and external wall member 1072, server rack 702 positioned internally in the modular data pod 70 in proximity to external wall member 1072 and also in proximity to external wall member 1073, server rack 703 positioned internally in the modular data pod 70 in proximity to external wall member 1073, server rack 704 positioned internally in the modular data pod 70 in proximity to external wall member 1074, server rack 705 positioned internally in the modular data pod 70 in proximity to external wall member 1075, server rack 706 positioned internally in the modular data pod 70 in proximity to external wall member 1076, server rack 707 positioned internally in the modular data pod 70 in proximity to both external wall member 1076 and external wall member 1077, and server rack 708 positioned internally in the modular data pod 70 in proximity to both external wall member 1077 and external wall member 1071.

In a similar manner as described above with respect to modular data pods 50 and 60, the server racks 701 to 708 are contiguously or substantially contiguously disposed to define heat exchange volume 7002 substantially within a central region of the modular data pod 70.

Similarly, the modular data pod 70 also includes an auxiliary enclosure 717 adjacent to one of the external wall members 1071 to 1077, with the auxiliary enclosure 717 illustrated as being adjacent to external wall member 1071. Similarly, the auxiliary enclosure 717 includes a close-coupled dedicated cooling system 727 for operation in high wet-bulb temperature applications which is further described in detail below with respect to FIGS. 3, 4 and 5.

In one embodiment of the present disclosure as illustrated in FIG. 2D, modular octagonal data pod 80 includes an enclosure 108 including eight external wall members 1081, 1082, 1083, 1084, 1085, 1086, 1087 and 1088 that are contiguously joined to one another along at least one edge in the shape of a polygon. The octagonal modular data pod 80 includes server racks 801, 802, 803, 804, 805, 806, 807 and 808, each of which is positioned internally in the modular data pod 80 in proximity to, and in a position in angular relationship with two of the external wall members 1081-1088.

Again, in a similar manner as described above with respect to modular data pods 50, 60 and 70, the server racks 801 to 808 are contiguously or substantially contiguously disposed to define heat exchange volume 8002 substantially within a central region of the modular data pod 80.

Similarly, the modular data pod 80 also includes an auxiliary enclosure 818 adjacent to one of the external wall members 1081 to 1088, with the auxiliary enclosure 818 illustrated as being adjacent to external wall member 1081. As described previously, the auxiliary enclosure 818 includes a close-coupled dedicated cooling system 828 for operation in high wet-bulb temperature applications which is further described in detail below with respect to FIGS. 3, 4 and 5.

Figure 2E:
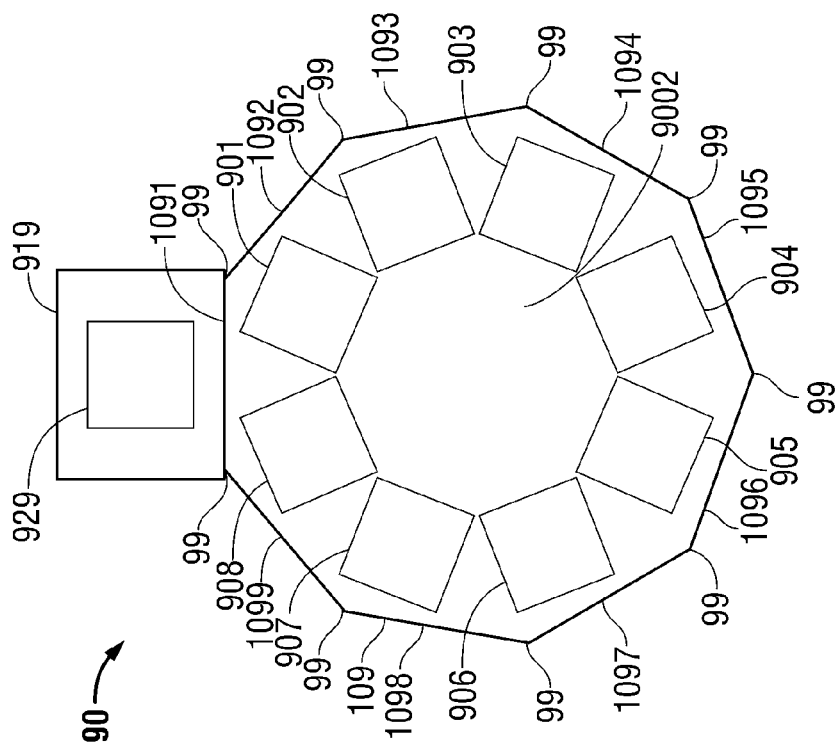
FIG. 2E is an illustration of a modular data pod having a nonagonal wall configuration according to yet another embodiment of the present disclosure.

In one embodiment of the present disclosure as illustrated in FIG. 2E, modular nonagonal data pod 90 includes an enclosure 109 including nine external wall members 1091, 1092, 1093, 1094, 1095, 1096, 1097, 1098, and 1099 that are contiguously joined to one another along at least one edge, e.g., edges 99, to form the shape of a polygon. The nonagonal modular data pod 90 includes eight server racks 901, 902, 903, 904, 905, 906, 907, and 908 positioned internally in the modular data pod 90 in proximity to, and in a position in angular relationship with, at least one of the external wall members 1091 to 1099.

In a similar manner as described above with respect to modular data pods 50, 60, 70, and 80, the server racks 901 to 808 are contiguously or substantially contiguously disposed to define heat exchange volume 9002 substantially within a central region of the modular data pod 90.

The modular data pod 90 also includes an auxiliary enclosure 919 adjacent to one of the external wall members 1091 to 1099, with the auxiliary enclosure 919 illustrated as being adjacent to external wall member 1091. As described above, the auxiliary enclosure 919 includes a close-coupled dedicated cooling system 928 for operation in high wet-bulb temperature applications, which is further described in detail below with respect to FIGS. 2, 3, and 4.

In another embodiment of the present disclosure as illustrated in FIG. 2F, a modular decagonal data pod 100 includes an enclosure 110 having ten external wall members 1101, 1102, 1103, 1104, 1105, 1106, 1107, 1108, 1109, and 1110 that are contiguously joined to one another along at least one edge, e.g., edges 111, in the shape of a polygon. The decagonal modular data pod 100 includes eight server racks 1001, 1002, 1003, 1004, 1005, 1006, 1007, and 1008 positioned internally in the decagonal modular data pod 100 in proximity to, and in a position in angular relationship with, at least one of the ten external wall members 1101 to 1110.

Again, in a similar manner as described above with respect to modular data pods 50, 60, 70, 80, and 90, the server racks 1001 to 1008 are contiguously or substantially contiguously disposed to define a heat exchange volume 102 substantially within a central region of the modular data pod 100.

Again, the modular data pod 100 also includes an auxiliary enclosure 1010 adjacent to one of the external wall members 1101 to 1110, with the auxiliary enclosure 1010 illustrated as being adjacent to external wall member 1101. Again, the auxiliary enclosure 1010 includes a close-coupled dedicated cooling system 1020 for operation in high wet-bulb temperature applications which is further described in detail below with respect to FIGS. 3, 4, and 5.

Figure 2G:
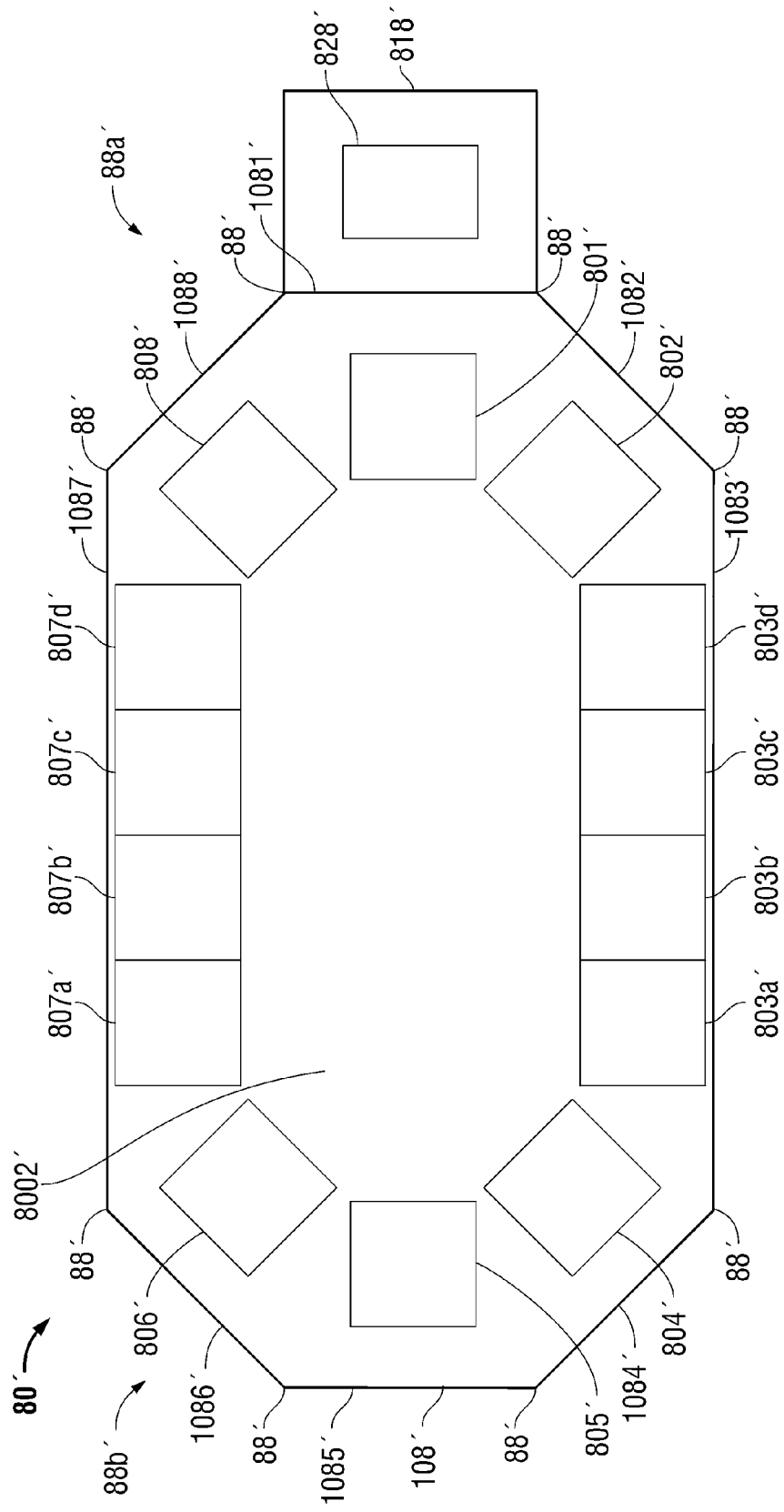
FIG. 2G is an illustration of the octagonal-shaped modular data pod of FIG. 2D having two elongated walls forming a modular data pod according to another embodiment of the present disclosure.

In another embodiment of the present disclosure as illustrated in FIG. 2G, the octagonal-shaped modular data pod 80 of FIG. 2D can be stretched in one direction to increase the length of two walls of the modular data pod 80 to form an elongated octagonal modular data pod 80'. More particularly, the octagonal modular data pod 80' includes an enclosure 108' having external wall members 1081', 1082', 1083', 1084', 1085', 1086', 1087', and 1088' that are contiguously joined to one another along at least one edge, e.g., edges 88', in the shape of a polygon.

The octagonal modular data pod 80' includes server racks 801' and 802' that are positioned internally in the modular data pod 80' in proximity to external wall member 1081' and external wall member 1082', respectively. Adjacent server racks 803a', 803b', 803c', and 803d' are also positioned internally in the octagonal modular data pod 80', each in proximity to elongated external wall member 1083'. Server racks 804', 805', and 806' are positioned internally within the modular data pod 80' in proximity to external wall members 1084', 1085', and 1085', respectively. Adjacent server racks 807a', 807b', 807c', and 807d' are also positioned internally in the octagonal modular data pod 80', each in proximity to elongated external wall member 1087'. Server rack 808' is also positioned internally in the octagonal modular data pod 80' in proximity to external wall member 1088'.

Contiguous external wall members 1088', 1081', and 1082' form a first end 88a' of the modular data pod 80' while correspondingly contiguous external wall members 1084', 1085', and 1086' form a second end 88b' of the modular data pod 80'. Similarly, as described above with respect to modular data pods 50, 60, 70, 80, 90, and 100, the server racks 801' to 808' are contiguously or substantially contiguously disposed to define heat exchange volume 8002' substantially within a central region of the modular data pod 80.

Again, the modular data pod 80' also includes an auxiliary enclosure 818' adjacent to one of the external wall members 1081' to 1088', with the auxiliary enclosure 818' illustrated as being adjacent to external wall member 1081'. Similarly, the auxiliary enclosure 818' includes a close-coupled dedicated cooling system 828' for operation in high wet-bulb temperature applications which is further described in detail below with respect to FIGS. 3, 4, and 5.

Figure 3:
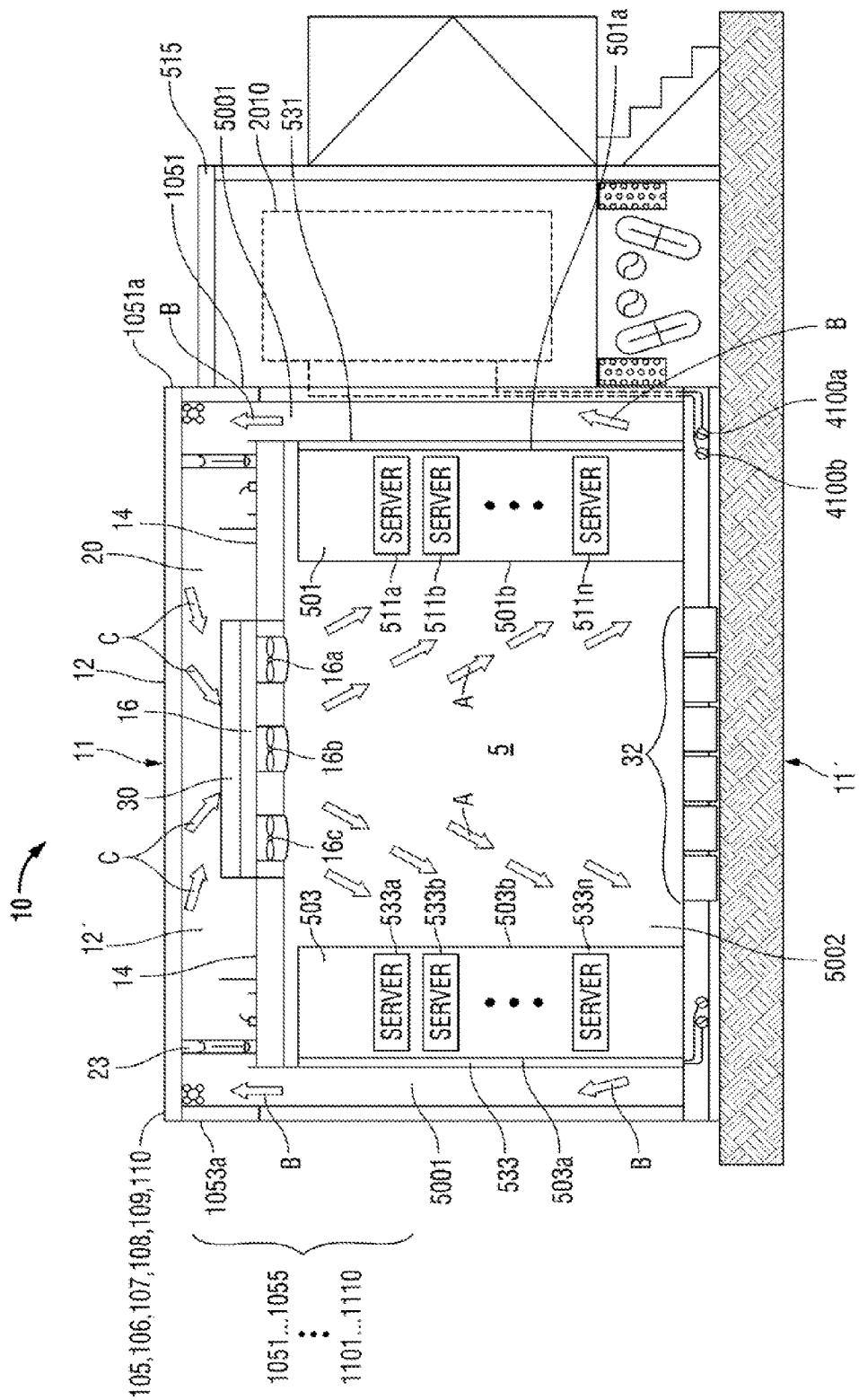
FIG. 3 is an elevation view (i.e., sectional side view) of a generic modular data pod including a hot aisle and a cold aisle according to embodiments of the present disclosure.

FIG. 3 is a sectional side view (i.e., elevation view) of a generic modular data pod generically designated as modular data pod 10. FIG. 3 illustrates an airflow pattern within the airflow circuit of the cooling system for a modular data pod. The modular data pods may use a variety of airflow patterns and hot and cold aisle configurations. For example, as shown in FIG. 3, the hot aisle can be at the rear or sides of the server rack and the cold aisle can be at the center of the modular data pod. This airflow pattern provides a natural chimney or upward convection of hot air within the hot aisle while the cold aisle is a natural downward airflow pattern of cold air that can be assisted by the fans.

As another example, the hot aisle could be in the center and the cold aisle would be at the rear of the server racks. The top of the racks could also be modified to allow hot air to flow within the rack or shelf itself and exit at either the top or the bottom of the racks. With respect to airflow patterns, the hot air may flow in an upward, downward, or other direction.

The modular data pods may also be designed to maintain neutralization temperatures at various locations in the airflow circuit. In the embodiment of FIG. 3, the primary cooling occurs at the rear of the server racks or shelving.

The fans may be arranged in other ways to create other airflow patterns known to those skilled in the art. The fans may also be positioned anywhere within the modular data pod. For example, the fans may be positioned in the upper or lower portion of the modular data and they may be oriented horizontally or vertically. The position and type of fan may depend on the latest advances in fan technology, including improvements in fan efficiency.

The cooling coil configuration shown in FIG. 3 provides redundancy by providing three ways (N+3) of cooling the air within the modular data pod. The one or more batteries may be mounted within the floor chamber as shown in FIG. 3 or somewhere within the cold aisle.

More particularly, modular data pod 10 generically represents, for example, modular data pods 50, 60, 70, 80, 90, 100, and 80' described above with respect to FIGS. 2A to 2G, respectively. Modular data pod 10 includes a data pod covering member 12 that substantially forms a roof of the modular data pod 10. The data pod covering member 12 may be in contact with, and supported by, for example, upper edges 1051a and 1053a of the external wall members 1051 and 1053, respectively, of data pod 50 (see FIG. 2A). The external wall members 1051 to 1055 define an aperture 12' at an upper end 11 of the enclosure 105 and also define inner surfaces 1051a, 1052a, 1053a, 1054a, and 1055a of the external wall members 1051 to 1055, respectively (see FIG. 2A). Thus, the data pod covering member 12 is configured and disposed to substantially cover the aperture 12'.

The computer racks 501 to 505 each define first sides 501a, 502a, 503a, 504a, 505a in relationship with the inner surfaces 1051a to 1055a of the external wall members 1051 to 1055, respectively, to define a first volume or hot aisle 5001 between the inner surfaces 1051a, 1052a, 1053a, 1054a, and 1055a and the first sides 501a, 502a, 503a, 504a, 505a defined by the computer racks 501 to 505, respectively. First cooling coils 531 and 533 are illustrated disposed on the first sides 501a and 503a of server racks 501 and 503, respectively.

The computer racks 501 to 505 each define second sides 501b, 502b, 503b, 504b, 505b, respectively, that are substantially oriented to interface with at least another second side to define a second volume therebetween, e.g., the heat exchange volume or cold aisle 5002 described above with respect to FIG. 2A. Those skilled in the art will recognize that heat exchange volumes 6002, 7002, 8002, 9002, 102, and 8002' illustrated in FIGS. 2B, 2C, 2D, 2E, 2F, and 2G, respectively, similarly form second volumes defined by the respective second sides of the computer racks.

The modular data pod 10 also includes a computer rack covering member 14 that is configured and disposed generally above the server racks 501 to 505 to substantially enclose the second volume or heat exchange volume 5002. The data pod covering member 12 and the computer rack covering member 14 form a third volume 20 that couples the first volume 5001 to the second volume 5002.

An air circulator support structure 16 is also configured and disposed generally above the server racks 501 to 505 and forms part of the computer rack covering member 14. The air circulator support structure 16 is generally disposed above the second volume 5002 to define a central upper boundary of the second volume 5002. The air circulator support structure 16 includes at least one air circulator, of which three air circulators 16a, 16b, and 16c are illustrated for circulating air downwardly, as shown by arrows A. The second volume 5002 forms a cold aisle. The downwardly circulating air circulates through the servers 511a, 511b, . . . , 511n disposed on server rack 501 and through the servers 533a, 533b, . . . , 533n to remove heat therefrom, and through the first cooling coils 531 and 533, where the air heated by the servers is then cooled. (Similar cooling coils, not shown, are disposed on first sides 502a, 504a, and 505a of server racks 502, 504, and 505, respectively).

The cooled air moves upwardly through the first volume 5001 as shown by the arrows B and further moves upwardly to the third volume 20. In one embodiment, second cooling coils 21 and 23 are disposed in the path of the circulating air between the computer rack covering member 14 and the data pod covering member 12, and in a position generally directly overhead corresponding first cooling coils 531 and 533 of server racks 501 and 503, respectively, to define the boundaries of the third volume 20. The second cooling coils 21 and 23 further cool the air, which then moves into the third volume 20 as shown by the arrows C where the air is drawn through the suction sides of the air circulators 16a, 16b, and 16c.

In one embodiment, the air circulator support structure 16 further includes a third cooling coil 30 that is disposed on the suction sides of the air circulators 16a, 16b, 16c for further cooling of the air circulating through the air circulators 16a, 16b, 16c.

Thus, the one or more air circulators 16a, 16b and 16c are configured to continuously circulate air through the first volume 5001, the second volume 5002, and third volume 5003.

In one embodiment, the cooling coils 531, 533, 21, 22, and 30 include a refrigerant, non-aqueous solution, gas, or liquid as the cooling medium. As defined herein, the cooling coils 531, 533, 21, 22, and 30 are heat exchange members.

In one embodiment, the modular data pod 10 includes a dedicated electrical power supply, illustrated as one or more batteries 32 at a lower end 11' of the data pod enclosure 105. The one or more batteries may be in electrical communication with a direct current to alternating current (DC/AC) inverter (not shown), which, in turn, is in electrical communication with an offsite electrical power grid (not shown).

Consequently, in the exemplary embodiment of FIG. 3, a hot aisle is formed between a back side of the IT cabinets or computer server racks and the walls of the modular data pod and a cold aisle is formed by a front side of the computer racks. In other words, the computer racks or shelving are positioned to create a hot aisle and a cold aisle. In other embodiments, the computer racks are positioned in other ways to create other hot and cold aisle configurations. In yet other embodiments, the hot and cold aisles are strictly contained.

The fans, coils, computer racks, one or more batteries, hot aisle, cold aisle, and piping tunnels are all positioned within the modular data pod envelop or container. Additional compartments are attached to a side of the modular data pod. These compartments include an exchanger module, pipes for the cooling system, a pump for pumping cooling fluid (e.g., refrigerant or deionized water) through the pipes, cable buses, and electrical compartments. These compartments may be waterproof. A user may access these compartments, e.g., to perform deployment or maintenance tasks, via an access door.

The fans may be arranged in other ways to create other airflow patterns known to those skilled in the art. The fans may be positioned anywhere within the modular data pod. For example, the fans may be positioned in the upper or lower portion of the modular data pod and they may be oriented horizontally or vertically. The position and type of fan may depend on the latest advances in fan technology, including improvements in fan efficiency.

The modular data pods are designed to include significant ramp up (or modularity) capabilities in power, data collection, and HVAC cooling capacity. Each pod may be designed to handle a spectrum of server rack loads from the low end, i.e., about 1-2 kW per server rack, to the high end, i.e., about 40 kW per server rack.

The modular data pods may use both natural convection and air movement devices (e.g., fans or other devices that can move air or create air patterns) to move air through the hot aisle/cold aisle circuit. The air movement devices may be coupled to energy efficient VFDs that can control the air movement devices using state of the art control strategies that monitor both cold aisle temperature and server and rack loading according to cloud computing technology.

The cooling coils in the modular data pods may employ micro-channel coil technology. These cooling coils require far less depth and surface area than typical cooling coils. The modular data pods may be built with removable coil sections that are adapted to accept replacement coils, such as coils that provide higher output or that incorporate future advances in coil technology. The modular data pod main coil circuit may include a hybrid dual coil systems consisting of a standard refrigerant evaporation coil, a receiver, and a tandem micro-channel coil. This pairing of coil technology enables greater heat transfer capabilities by using the benefits of refrigerant "change of state." Alternatively, the system can include a straight liquid-pumped system without change of state.

The modular data pods may be built to various seal classifications. For example, the membrane sealants, wall construction, gasketing, and door treatments may be adjusted to meet various seal requirements including the seal requirements promulgated by Sheet Metal and Cooling Contractors' National Association (SMACNA). The modular data pods may also include non-conductive fire suppression systems.

The modular data pods may be designed to receive either manufactured server racks or custom designed rack and shelving components. Custom racks or shelving components can be included as part of the overall physical structure of the modular data pod to provide a strong "skeletal" system that can be easily removed, adapted, and modified, to conform to the various types of server supports.

The modular data pod structure may be a durable but light structure. For example, it may be made of a composite of light steel square tubing or I-beams and heavy gauge aluminum structural members. The walls and roof of the modular data pods can include either double or single-wall insulated panels. They can be constructed of metal, plastic, glass, or other composite materials. The modular data pods can have structural skeletal framing, or receive skin treatments that have structural capabilities. The type and extent of insulation used in the modular data pod may vary based on the environment in which the pod is deployed or any other requirements of an operator.

The exterior of the modular data pods may be treated with energy-saving reflective paints, surface coatings, or solar membranes (e.g., photovoltaic) or coatings. The roof structure may include supports and hold downs for solar panels in farm-type applications.

The modular data pod structure can be fitted with lifting lug and support structures than will enable it to be lifted from above or below using forklifts, gantry, cranes, helicopters, or other rigging equipment. The server racks or shelving may include restraints to secure the server racks and other equipment in the modular data pod for transport.

The modular data pods can be fitted with packaged humidity controls and systems. For example, the modular data pods can be fitted with membrane, vapor barriers, sealants, and other humidity control features to limit migration of humidity from external spaces or the environment into the modular data pod envelop.

The modular data pods may or may not include access doors. The doors may include double marine insulated vision glass for external inspection of the modular data pod. The modular data pods may be fitted with lighting and service receptacles, both internally and externally as needed. All electrical circuits may be protected with ground fault protection. Modular data pods intended for outdoor use may include structure for lightning protection.

The modular data pods may be pre-stacked with computer racks at a centrally-controlled location before they are deployed on site. This saves the time and expense required to stack a modular data pod with computer racks on site, especially in remote areas.

Figure 4:
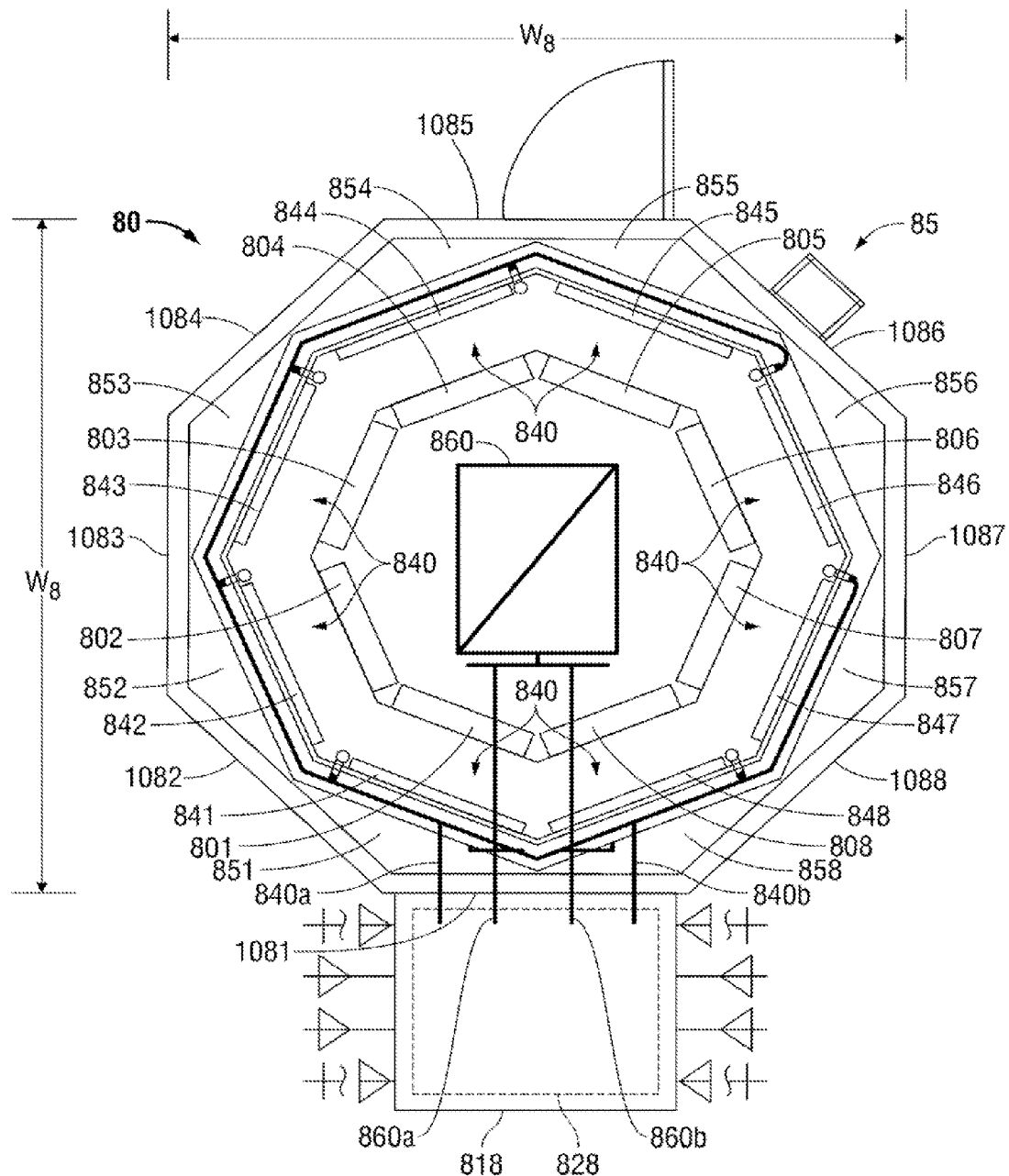
FIG. 4 is a plan view (i.e., sectional top view) of a modular data pod showing an upper coil deck according to embodiments of the present disclosure.

FIG. 4 is a plan view (i.e., sectional top view) of the octagonal modular data pod 80 of FIG. 2D showing an octagonal upper coil deck 838*a* that vertically supports an array 840 of vertically disposed upper cooling coils 841, 842, 843, 844, 845, 846, 847, and 848 disposed above respective server racks 801, 802, 803, 804, 805, 805, 806, 807, and 808. Each of the vertically disposed upper cooling coils 841, 842, 843, 844, 845, 846, 847, and 848 forms a boundary in an analogous manner to second cooling coils 21 and 22 that are disposed in the path of the circulating air between the computer rack covering member 14 and the data pod covering member 12 to define the boundaries of the third volume 20 as described with respect to modular data pod 10 in FIG. 3.

Lower rear coils on the back side (not shown) of each of the computer racks 801 to 808 are analogous to refrigerant coils 531 and 533 in FIG. 3. The lower rear coils are the first stage or the primary way of cooling the air flowing in hot aisles 851, 852, 853, 854, 855, 856, 857, and 858. Hot aisle 851 is formed between the rear side of server rack 801 and external wall members 1081 and 1082. Hot aisle 852 is formed between the rear side of server rack 802 and external wall members 1082 and 1083. Similarly, hot aisle 853 is formed between the rear side of server rack 803 and external wall members 1083 and 1084. Hot aisle 854 is formed between the rear side of server rack 804 and external wall members 1084 and 1085. Those skilled in the art will recognize how hot aisles 855 to 858 are similarly formed.

The upper vertical coil array 840, which is in an octagonal shape, is the secondary way of cooling (n+2) the air flowing in the hot aisles 851 to 858. Piping connections 840*a* and 840*b* provide fluidic communication with a refrigerant gas fluid supply path 4100*a*, which is in fluid communication with the environment 5 of the electronic equipment, and fluid return path 4100*b*, which is also in fluid communication with the environment 5 of the electronic equipment, described below with respect to FIG. 6.

An overhead flat-plate coil 860, analogous to third cooling coil 30 that is disposed on the suction sides of the air circulators 16*a*, 16*b*, 16*c* may be positioned at the center (as shown) of the modular data pod 80 as the third way of cooling (n+3) the air flowing from the hot aisles 851 to 858. This third coil 860 can also be used as a "trim" coil if the heat load at any server rack coil requires supplemental cooling. The third coil 860 handles the occasional overloading at specific server racks. The third coil 860 can also be used as an energy-saving coil for extremely low-load heat output conditions. The control strategies for cooling server racks within the modular data pod 80 may include shutting down the primary or main coils (not shown) and activating the third coil 860 to handle low system loads. Piping connections 860*a* and 860*b* provide fluidic communication with the refrigerant gas fluid supply path 4100*a*, which is in fluid communication with the environment 5 of the electronic equipment, and fluid return path 4100*b*, which is also in fluid communication with the environment 5 of the electronic equipment, described below with respect to FIG. 6.

Figure 5:
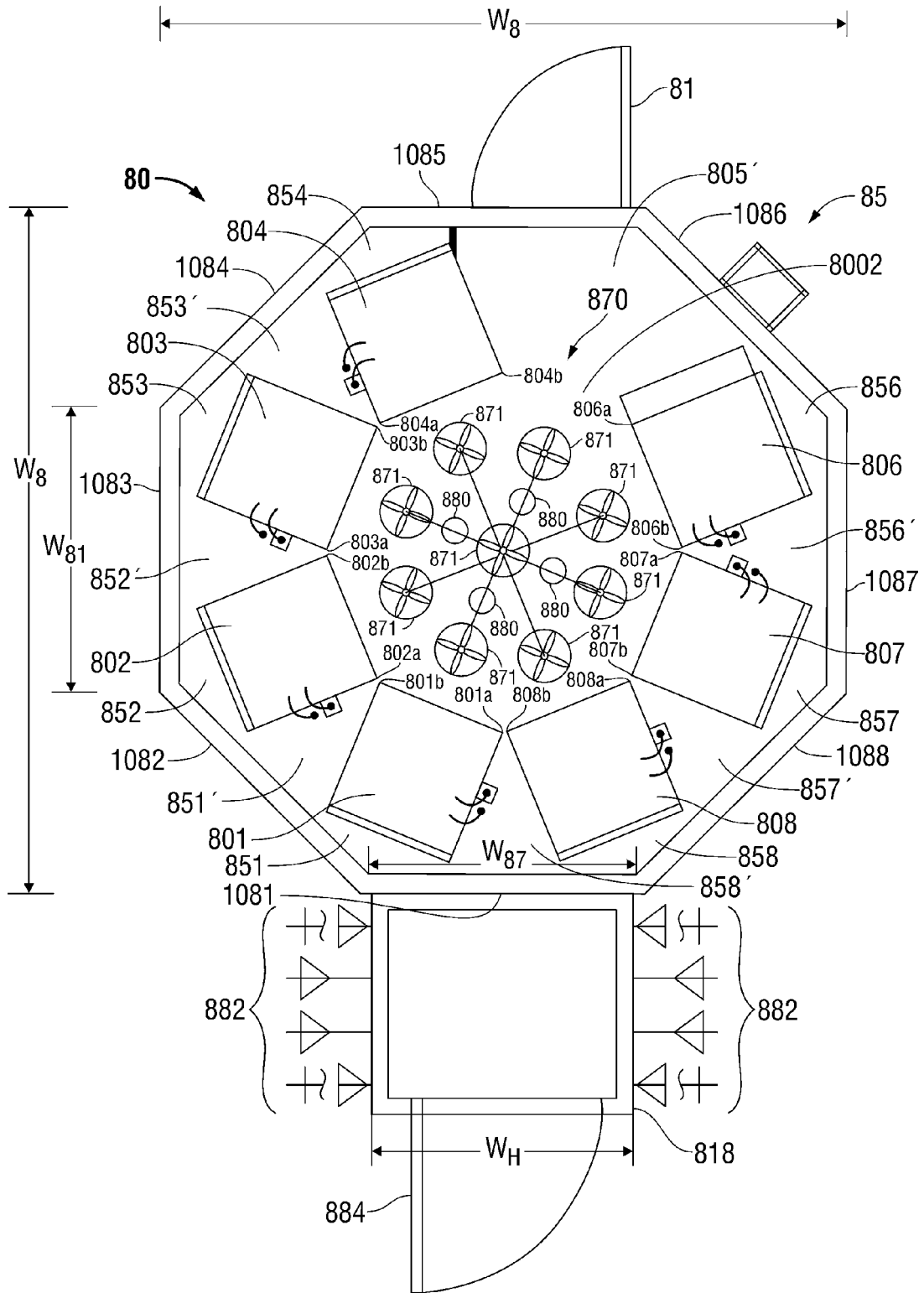
FIG. 5 is a plan view (i.e., sectional top view) of a modular data pod showing a ceiling fan assembly according to embodiments of the present disclosure.

FIG. 5 is a plan view (i.e., sectional top view) at the ceiling level of modular data pod 80 showing a ceiling fan assembly 870. The computer racks 801 to 804 and 806 to 806 each include corners 801*a*, 801*b* for server rack 801, corners 802*a*, 802*b* for server rack 802, corners 803*a*, 803*b* for server rack 803, corners 804*a*, 804*b* for server rack 804, corners 806*a*, 806*b* for server rack 806, corners 807*a*, 807*b* for server rack 807, and corners 808*a*, 808*b* for server rack 808. The server racks 801 to 804 and 806 to 808 are shown disposed in a circular pattern with corners 801*a* and 801*b* of rack 801 in contact with the corners 808*b* and 802*a* of adjacent computer racks 808 and 802, respectively.

Those skilled in the art will understand the arrangement of the corners of the remaining server racks 802, 803, 804, 806, and 807. This arrangement of the server racks 801 to 804 and 806 to 808 in a circular pattern provides a partition between the hot aisles 851 to 854 and 856 to 858 and the cold aisle formed by volume 8002. In some embodiments, the pie-shaped air spaces 851', 852', 853', 856', 857', and 858' between the computer racks 801 and 802, 802 and 803, 803 and 804, 806 and 807, 807 and 808, and 808 and 801, respectively, may be partitioned off from the cold aisle 8002 and form part of the hot aisles 851, 852, 853, 854, 856, 857, and 858. As shown in FIG. 5, the modular data pod may fit seven server racks (e.g., 40 kW server racks). There is a space 805' between two server racks, e.g., server racks 804 and 806, to give a human operator access to the server racks 801-804 and 806-808 via access door 81. In some embodiments, the modular data pod does not include an access door. In these embodiments, the modular data pod may fit eight server racks.

Fans 871 of fan assembly 870 and lighting 880 are positioned at the ceiling level of the modular data pod 80. The fans are driven by variable-frequency drives (VFDs) (not shown), which may be controlled by the central cooling system 1420 of a Building Management System (BMS). The central cooling system 1420 can increase or decrease the fan speed based on temperature and/or the loading of the computer racks. For example, the central cooling system 1420 can increase the fan speed as the temperature within the hot aisles increases.

FIG. 5 also shows the cooling pipes 882 that enter and exit a lower pipe chase (not shown). The lower pipe chase may be removable and may be located below auxiliary enclosure 818 that includes the heat exchangers (the complete close-coupled cooling system 4000, which includes condensers 1200*a*, 1200*b*, and 1300, is described below with respect to FIG. 6) and electrical equipment of the modular data pod assembly. The cooling pipes 882 include six pipes: two supply pipes for supplying cooling fluid to the coils of the modular data pod, two return pipes for returning cooling fluid to the cooling system, and two reverse return pipes. The modular data pod assembly may include waterproof partitions between the various compartments.

The exemplary modular data pods 10, 50, 60, 70, 80, 90, 100, and 80' are designed to be universal in their use for computer data storage. They can be used for singular pod deployment. They can be trailerized for temporary or semi-permanent use. They can be used indoors in warehouse or suite-type applications. They can be deployed in outdoor or "farm"-type environments. The benefit of their space-saving shape, size, and relative weight allows them to be implemented where it is not practical logistically or otherwise to use other large and heavy "containerized" modular products.

Figure 6:
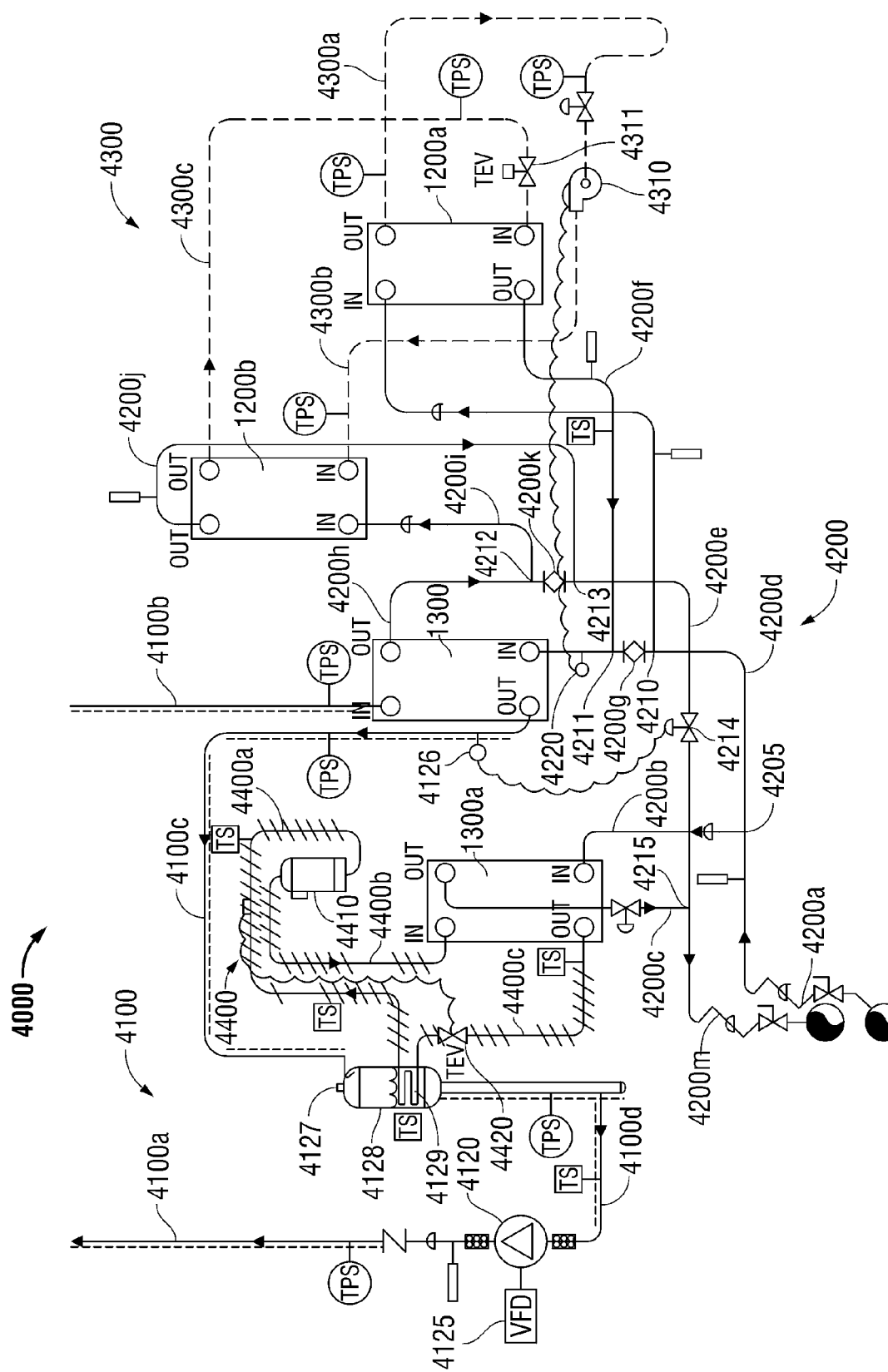
FIG. 6 is a flow diagram for a close-coupled cooling system for operation in high wet-bulb temperature applications according to embodiments of the present disclosure.

FIG. 6 depicts a close-coupled cooling system 4000 designed to cool electronic equipment of an IT data center. The system 4000 includes four independent, yet cooperating, fluid circuits designated as 4100, 4200, 4300, and 4400, respectively.

The first circuit 4100 interfaces with the electronic equipment of the IT data center, and provides cooling to the electronic equipment via a first fluid. The first fluid may contain a liquid refrigerant R134a or similar refrigerants. The first circuit 4100 includes at least one evaporator coil (not shown in FIG. 6, but see, e.g., the evaporator coils of FIG. 12) that is in thermal communication with the electronic equipment and extracts heat from the electronic equipment to the first fluid. As the first fluid flows from an inlet of the at least one evaporator coil to an outlet of the evaporator coil, heat is transferred from the electronic equipment to the first fluid. In one embodiment, the first fluid enters the at least one evaporator coil at a temperature of approximately 23° C. During heat transfer or exchange, the first fluid transforms from a liquid state to an at least partially vapor state.

The first circuit 4100 includes a fluid supply path 4100a and a fluid return path 4100b coupled to the inlet and outlet of the at least one evaporator coil, respectively. The fluid supply path 4100a delivers the first fluid in a liquid state to the inlet of the at least one evaporator coil, and the fluid return path 4100b receives the first fluid in an at least partially vapor state from the outlet of the at least one evaporator coil. The first circuit 4100 includes a liquid refrigerant pump 4120 that pumps the first fluid through the fluid supply path 4100a. The first circuit 4100 also includes a variable frequency drive 4125 that regulates capacity and motor speed of the liquid refrigerant pump 4120.

The first circuit 4100 further includes a main condenser 1300 that receives the first fluid from the fluid return path 4100b. The main condenser 1300 is a refrigerant-to-water heat exchanger that cools the first fluid that passes through the main condenser 1300 and condenses the first fluid from the at least partially vapor state to the liquid state. In one embodiment, to fully condense and cool the first fluid, the main condenser 1300 is maintained at a predetermined condensing temperature of approximately 23.3° C. or lower.

Further, the first circuit 4100 may include (1) a fluid path 4100c that carries the first fluid from the main condenser 1300 to a refrigerant liquid receiver 4128, and (2) a fluid path 4100d that carries the first fluid from the refrigerant liquid receiver 4128 to a suction side of the liquid refrigerant pump 4120.

The refrigerant liquid receiver 4128 is configured to detect and regulate the temperature of the first fluid. Specifically, the refrigerant liquid receiver 4128 is configured to reduce the temperature of the first fluid by thermally coupling the first circuit 4100 to the fourth circuit 4400. In some embodiments, the refrigerant liquid receiver 4128 maintains the first fluid at a predetermined temperature between approximately 22.2° C. and approximately 23.3° C.

The refrigerant liquid receiver 4128 may also include components (e.g., a detector and a controller) configured to detect and regulate the liquid level of the first fluid contained in the refrigerant liquid receiver 4128. A low liquid level in the refrigerant liquid receiver 4128 may cause cavitation problems at the liquid refrigerant pump 4120. To avoid this problem, the refrigerant liquid receiver 4128 includes a liquid level controller 4127 that detects the liquid level in the receiver 4128 and triggers an alarm if a low liquid level is detected. Also, the refrigerant liquid receiver 4128 may collect the first fluid in the first circuit 4100 when the cooling system 4000 is in an idle or standby mode.

The first circuit 4100 also includes a temperature sensor 4126 that is located on the fluid path 4100c at the exit of the main condenser 1300. The temperature sensor 4126 detects the temperature of the first fluid when it exits from the main condenser 1300. The readings of the temperature sensor 4126 reflect the temperature of the main condenser 1300.

The second circuit 4200 interfaces with the first circuit 4100 at the main condenser 1300a, where the second circuit 4200 performs heat exchange with the first circuit 4100. Specifically, the second circuit 4200 has a second fluid flowing through it. The second fluid removes heat from the first fluid of the first circuit 4100 at the main condenser 1300a. In one embodiment, upon exiting the main condenser 1300a, the second fluid has a temperature of approximately 22.8° C.

The second circuit 4200 includes a fluid path 4200a that carries the second fluid from a cooling tower, fluid cooler, or dry cooler (not shown in FIG. 6, but see, e.g., cooling tower CT-1A of FIG. 14) to the second circuit 4200. The fluid path 4200a is fluidly coupled to a fluid path 4200d which delivers the second fluid to the main condenser 1300. The second circuit further includes a fluid path 4200h that receives the second fluid from the main condenser 1300. The fluid path 4200h is fluidly coupled to a fluid path 4200e which carries the second fluid to a fluid path 4200m that delivers the second fluid back to the cooling tower, fluid cooler, or dry cooler.

In some embodiments, the second circuit 4200 includes a pump to facilitate the flow of the second fluid through the second circuit 4200. In one embodiment, the second fluid is regulated at a flow rate of approximately 1192 liters/minute. The pump may be in any of the following forms: a central pumping and cooling tower, dry cooler, fluid cooler, well water circuit, or other chilled water circuit.

Further, the second circuit 4200 may include a mixed water temperature sensor 4220 that monitors the temperature of the second fluid before it enters the main condenser 1300. The second circuit 4200 may also include a water regulating valve 4214, which operatively communicates with the temperature sensor 4126 of the first circuit 4100. The water regulating valve 4214 is configured to regulate the flow rate of the second fluid in proportion to the readings of the temperature sensor 4126.

For instance, to maintain the main condenser 1300 at or below a predetermined condensing temperature (e.g., 23.3° C.), the water regulating valve 4214 adjusts the flow rate of the second fluid based on the temperature of the main condenser 1300 as measured by the temperature sensor 4126. For example, if the temperature sensor 4126 has a reading significantly higher than the predetermined condensing temperature (e.g., 23.3° C.) of the main condenser 1300, the water regulating valve 4214 then significantly increases the flow rate of the second fluid flowing through the second circuit 4200 to thereby rapidly reduce the temperature of the main condenser 1300. However, if the temperature sensor 4126 has a reading slightly higher than the predetermined condensing temperature (e.g., 23.3° C.), the water regulating valve 4214 then slightly increases the flow rate of the second fluid flowing through the second circuit 4200.

In some embodiments, to maintain the temperature of the main condenser 1300 at or below the predetermined condensing temperature (e.g., 23.3° C.), the second fluid is maintained at a threshold temperature of approximately 18.9° C. or lower.

To maintain the second fluid at or below the threshold temperature (e.g., 18.9° C.), the second circuit 4200 may include at least one cooling mode to cool the second fluid. For example, the second circuit 4200 may include a simple free-cooling mode in which the second circuit 4200 relies on the atmosphere to cool the second fluid via a cooling tower, fluid cooler, or dry cooler. In operation, after heat is transferred from the first fluid to the second fluid at the main condenser 1300, the second fluid follows the fluid paths 4200*h*, 4200*e* and proceeds to a cooling tower, fluid cooler, or dry cooler (not shown in FIG. 6) to reject its heat into the atmosphere. The cooled second fluid then follows the fluid paths 4200*a* and 4200*d* back to the main condenser 1300 to cool the first fluid. It is envisioned that the second fluid may continuously repeat the above cycle.

In one embodiment, the simple free-cooling mode maintains the second fluid at or below the threshold temperature (e.g., 18.9° C.) only when the wet-bulb temperature of the IT data center is below 17.2° C. If the wet-bulb temperature is above 17.2° C., the second fluid may exceed its threshold temperature.

Further, the second circuit 4200 may include a mechanical compressed cooling mode, in which the third circuit 4300 cools the second circuit 4200 through mechanical compression cycles. A third fluid flows through the third circuit 4300. The third fluid may contain a liquid refrigerant, such as R134a, or any other suitable refrigerant.

The third circuit 4300 includes an atmospheric sub-cooler exchanger 1200*a* to sub-cool the second fluid 4200 before the second fluid arrives at the main condenser 1300. The atmospheric sub-cooler exchanger 1200*a* is a refrigerant-to-water heat exchanger that trims or cools at least a portion of the second fluid. The third circuit 4300 may also include a trim condenser 1200*b*, which is a refrigerant-to-water heat exchanger that transfers heat in the third fluid, which is the heat that the third fluid has absorbed from the second fluid at the atmospheric sub-cooler exchanger 1200*a*, back to the second fluid. The third circuit 4300 may further include a sub-cooler compressor 4310 that compresses the third fluid.

The third circuit 4300 includes a fluid path 4300*a* that carries the third fluid from the atmospheric sub-cooler exchanger 1200*a* to the sub-cooler compressor 4310 for compression, and a fluid path 4300*b* that carries the compressed third fluid to the trim condenser 1200*b*. Additionally, the third circuit 4300 includes a fluid path 4300*c* that carries the third fluid from the trim condenser 1200*b* to a metering device, or a thermal expansion valve 4311, which expands the third fluid back to the atmospheric sub-cooler exchanger 1200*a*. It is envisioned that the third fluid may continuously flow through the third circuit 4300 as long as the third circuit 4300 is activated.

In some embodiments, the third circuit 4300 is activated only when the second fluid exceeds its threshold temperature (e.g., 18.9° C.), which may occur when the wet-bulb temperature is over 17.2° C. The cooling capacity of the third circuit 4300 may be regulated in direct proportion to the wet-bulb temperature that is in excess of 17.2° C., as illustrated in Table 1 below.

TABLE 1

| WET-BULB TEMPERATURE | COOLING CAPACITY OF THE THIRD CIRCUIT 4300 |
| --- | --- |
| 63 wb (17.2° C.) | 0 kW |
| 64 wb (17.8° C.) | 45.7 kW |
| 65 wb (18.3° C.) | 91.4 kW |
| 66 wb (18.9° C.) | 137.2 kW |
| 67 wb (19.4° C.) | 182.9 kW |
| 68 wb (20° C.) | 228.6 kW |
| 69 wb (20.6° C.) | 274.3 kW |
| 70 wb (21.1° C.) | 320 kW |

The third circuit 4300 closely controls the temperature of the second fluid by trimming and cooling the temperature of the second fluid one degree at a time. For instance, if the second fluid temperature rises above its threshold temperature by one degree, the third circuit 4300 then reduces the temperature of the second fluid by one degree.

In one embodiment, for efficiency reasons, the second circuit 4200 directs a small portion of the second fluid to perform heat exchange with the third fluid, before the second fluid enters the main condenser 1300. Specifically, the second circuit 4200 includes a splitter tee 4210 on the fluid path 4200*d* before an inlet of the main condenser 1300. The splitter tee 4210 diverts a portion of the second fluid, e.g., approximately one third of the second fluid, to an inlet of the atmospheric sub-cooler exchanger 1200*a*. In some embodiments, the portion of the second fluid has a temperature of 22.2° C. at the inlet of the atmospheric sub-cooler exchanger 1200*a*.

The second circuit 4200 may include another splitter tee 4211 on the fluid path 4200*d* upstream from the splitter tee 4210. In conjunction with a flow balancing or flow control valve 4200*g* positioned in fluid path 4200*d* between splitter tee 4210 and splitter tee 4211, the splitter tee 4211 allows the portion of the second fluid to flow from an outlet of the atmospheric sub-cooler exchanger 1200*a* back to the fluid path 4200*d*. At the splitter tee 4211, the portion of the second fluid, e.g., approximately one third of the second fluid, rejoins the remaining portion of the second fluid, e.g., approximately two thirds of the second fluid.

The blended second fluid then proceeds to the main condenser 1300. In some embodiments, the blended second fluid has a temperature of approximately 18.9° C. before entering the main condenser 1300. Alternatively, depending upon the degree or percentage opening of the flow control or flow balancing valve 4200*g*, flow control or flow balancing valve 4200*g* can allow either complete or partial divergence of flow from the main condenser 1300 to the atmospheric sub-cooler exchanger 1200*a* or force flow in fluid path 4200*d* entirely through main condenser 1300.

Additionally, for efficiency reasons, the second circuit 4200 may direct only a small portion of the second fluid to perform heat exchange with the third fluid, after the second fluid exits from the main condenser 1300. Specifically, the second circuit 4200 includes a splitter tee 4212 on the fluid path 4200*h* at the exit of the main condenser 1300. The splitter tee 4212 diverts a portion of the second fluid, e.g., approximately one third of the second fluid, via a fluid path 4200*i* to the trim condenser 1200*b* to reclaim heat from the third fluid. In some embodiments, the approximately one third of the second fluid has a temperature of approximately 27.4° C. at an outlet of the trim condenser 1200*b*.

The second circuit 4200 may include an additional splitter tee 4213 on the fluid path 4200*h* downstream from the splitter tee 4212. In conjunction with a flow balancing or flow control valve 4200*k* positioned in fluid path 4200*e* between splitter tee 4212 and splitter tee 4213, the splitter tee 4213 allows the portion of the second fluid, e.g., approximately one third of the second fluid, exiting from the trim condenser 1200*b* to join the rest of the second fluid. At the splitter tee 4213, the portion of the second fluid, e.g., approximately one third of the second fluid, rejoins the remaining portion of the second fluid, e.g., approximately two thirds of the second fluid. In some embodiments, the blended second fluid has a temperature of approximately 26.4° C. at the splitter tee 4213. The blended second fluid then together follows the fluid paths 4200e, 4200m towards the exit of the second circuit 4200.

Alternatively, depending upon the degree or percentage opening of the flow balancing or flow control valve 4200k, flow balancing or flow control valve 4200k can allow either partial or complete divergence of flow from the main condenser 1300 to the trim condenser 1200b or force flow in fluid paths 4200h and 4200e entirely through main condenser 1300.

In some embodiments, the third circuit 4300 does not include the atmospheric sub-cooler exchanger 1200a or the trim condenser 1200b. Rather, the third circuit 4300 includes a trim chiller which is configured to cool the entire IT data center.

In one embodiment, the second circuit 4200 may exclusively have only one cooling mode, either the simple free-cooling mode or the mechanical compressed cooling mode described above.

In another embodiment, the second circuit 4200 may have both of the cooling modes that alternate with each other. For instance, the second circuit 4200 switches to the simple free-cooling mode when the wet-bulb temperature is at or below a threshold temperature, e.g., 17.2° C., and switches to the mechanical compressed cooling mode once the wet-bulb temperature exceeds the threshold temperature.

In other embodiments, the two cooling modes cooperate with other, and the second circuit 4200 may operate in both cooling modes concurrently. In these embodiments, the simple free-cooling mode is always on such that the simple free-cooling mode remains active regardless of the wet-bulb temperature. On the other hand, the mechanical compressed cooling mode, e.g., the third circuit 4300, is activated only when the simple free-cooling mode alone cannot maintain the second fluid at or below the threshold temperature, e.g., 18.9° C., such as when the wet-bulb temperature is above the threshold temperature, e.g., 17.2° C. In these embodiments, when the wet-bulb temperature is at or below its threshold temperature, the second circuit 4200 relies solely on the atmosphere for cooling. Once the wet-bulb temperature reaches beyond its threshold temperature, the third circuit 4300 is activated and is controlled to generate cooling capacity in proportion to the wet-bulb temperature that is in excess of the threshold temperature. It is envisioned that the third circuit 4300 can be turned on and off automatically without user intervention. For instance, the atmospheric sub-cooler exchanger 1200a automatically becomes active or inactive as the wet-bulb temperature crosses its threshold temperature.

Statistically, the cooling system 4000 operates exclusively in the simple free-cooling mode for approximately 95% of the operating time. The mechanical compressed cooling mode is turned on for approximately 5% of the operating time. In a geographical area where the wet-bulb temperature is about 18.3° C., the cooling system 4000 may run exclusively in the simple free-cooling mode virtually all year round and turns on the mechanical compressed cooling mode for less than 0.04% of the operating time. If the area has a wet-bulb temperature of about 20.6° C., the mechanical compressed cooling mode is active for about 3% of the operating time. In all these scenarios, a traditional, large, oversized cooling electrical infrastructure as in the prior art would rely on mechanical compression cycles for about 40-60% of its operating time, thus inducing a much higher operation cost than that of the cooling system 4000.

In addition to the second circuit 4200, the fourth circuit 4400 may also perform heat exchange with the first circuit 4100. Specifically, the fourth circuit 4400 interfaces with the first circuit 4100 at the refrigerant liquid receiver 4128 where the fourth circuit 4400 condenses and cools the first fluid via a fourth fluid that flows through the fourth circuit 4400. The refrigerant liquid receiver 4128 has a sub-cooler coil 4129, which is an evaporator thermally coupled to both the first circuit 4100 and the fourth circuit 4400.

The fourth circuit 4400 includes a sub-cooler compressor 4410 configured to compress the fourth fluid and a sub-cooler condenser 1300a, which transfers heat from the fourth circuit 4400 to the second circuit 4200. Both the sub-cooler compressor 4410 and the sub-cooler condenser 1300a are fluidly coupled to the sub-cooler coil 4129 of the refrigerant liquid receiver 4128.

The fourth circuit 4400 includes a fluid path 4400a that carries the fourth fluid from the receiver sub-cooler coil 4129 to a suction side of the sub-cooler compressor 4410 for compression, a fluid path 4400b that carries the compressed fourth fluid from the sub-cooler compressor 4410 to the sub-cooler condenser 1300a, and a fluid path 4400c that carries the fourth fluid from the sub-cooler condenser 1300a to a thermal expansion valve 4420, which expands the fourth fluid and provides the expanded fourth fluid to the sub-cooler coil 4129.

In some embodiments, the fourth circuit 4400 is automatically turned on and off based on the conditions detected by the refrigerant liquid receiver 4128. For instance, the fourth circuit 4400 becomes active when the liquid level detected by the refrigerant liquid receiver 4128 drops below a predetermined threshold. Specifically, the fourth circuit 4400 may be activated in response to an alarm signal generated by the liquid level controller 4127 when a low liquid level is detected, and may become inactive when the liquid level reaches the predetermined threshold. Further, the fourth circuit 4400 may also be controlled based on the temperature of the first fluid as detected by the refrigerant liquid receiver 4128. For instance, the fourth circuit 4400 may become active when the temperature of the first fluid exceeds a predetermined threshold, and become inactive when the temperature drops to or below the predetermined threshold.

The second circuit 4200 removes heat from the fourth circuit 4400 at the sub-cooler condenser 1300a. In some embodiments, the second circuit 4200 includes a splitter tee 4205 on the fluid path 4200d. The splitter tee 4205 includes a split path 4200b that diverts a small portion of the second fluid, e.g., approximately 19 liters/minute, to an inlet of the sub-cooler condenser 1300a where the small portion of the second fluid extracts heat from the fourth circuit 4400. The remaining, undiverted portion of the second fluid follows the fluid path 4200d to the main condenser 1300 to remove heat from the first circuit 4100.

The second circuit 4200 may also include another splitter tee 4215 on the fluid path 4200e. The splitter tee 4215 has a split branch 4200c that carries the small portion of the second fluid returned from an outlet of the sub-cooler condenser 1300a to the fluid path 4200e to join the rest of the second fluid proceeding towards the exit of the second circuit 4200. In one embodiment, the temperature of the second fluid at the splitter tee 4215 is approximately 26.4° C. when the fourth circuit 4400 is active, i.e., when the sub-cooler condenser 1300*a* is turned on, and approximately 26.7° C. when the fourth circuit 4400 is inactive, i.e., when the sub-cooler condenser 1300*a* is turned off.

The close-coupled cooling system 4000 may be installed in an auxiliary enclosure of a modular data pod and may provide chillerless cooling within a data enclosure of the modular data pod in high wet-bulb temperature applications. For example, the dedicated close-coupled cooling systems 525, 626, 727, 828, 1020, and 828' of FIGS. 2A-2D and 2F-2G, respectively, may include the close-coupled cooling system 4000 of FIG. 6.

The operation of the close-coupled cooling system 4000 may be summarized as follows. In the free-cooling mode of operation, the first cooling circuit 4100, which includes the liquid receiver 4128 and the liquid refrigerant pump 4120, and the second cooling circuit 4200, which includes the main condenser 1300, are in operation to transfer heat from the modular data pods 50, 60, 70, 80, 80', 90, or 100 described above via the fluid supply path 4100*a* and fluid return path 4100*b* and to reject heat to the environment via the low temperature supply path 4200*a* and via primary cooling coil cooling water return connection 4200*m*.

When the environmental conditions preclude exclusive reliance on the free-cooling mode of operation, e.g., if the wet-bulb temperature is at or exceeds a predetermined wet-bulb temperature limit, or if there is an increase in the heat load generated within the modular data pods 50, 60, 70, 80, 90, 100, or 80', the close-coupled cooling system 4000 is placed into an incremental, mechanical-assist cooling mode of operation. In the incremental, mechanical-assist cooling mode of operation, first cooling circuit 4100 and the second cooling circuit 4200 as described above with respect to the free-cooling mode of operation continue to remain in operation while the third cooling circuit 4300, which includes the trim condenser 1200*b*, the sub-cooler exchanger 1200*a*, and the sub-cooler compressor 4310, is placed into operation to permit incremental, additional cooling of the modular data pods 50, 60, 70, 80, 90, 100, or 80' such that the cooling capacities of the first, second, and third cooling circuits 4100, 4200, and 4300, respectively, are adjusted incrementally depending on the change in heat load from the modular data pods 50, 60, 70, 80, 90, 100, or 80' and/or any change in environmental conditions based on the wet-bulb temperature.

In an alternative incremental, mechanical-assist cooling mode of operation, the first cooling circuit 4100 and the second cooling circuit 4200 as described above with respect to the free-cooling mode of operation continue to remain in operation while the fourth cooling circuit 4400, which includes the sub-cooler condenser 1300*a* and the sub-cooler compressor 4410, is placed into operation to permit incremental, additional cooling of the modular data pods 50, 60, 70, 80, 90, 100, or 80' such that the cooling capacities of the first, second, and fourth cooling circuits 4100, 4200 and 4400, respectively, are adjusted incrementally depending on the increase or decrease in heat load from the modular data pods 50, 60, 70, 80, 90, 100, or 80' and/or any change in environmental conditions based on the wet-bulb temperature.

When the environmental conditions and/or the heat load from the modular data pods 50, 60, 70, 80, 90, 100, or 80' preclude exclusive reliance on the free-cooling mode of operation together with either one of the incremental mechanical-assist modes of operation, the close-coupled cooling system 4000 is placed into a supplemental, incremental, mechanical-assist mode of operation. In the supplemental, incremental, mechanical-assist mode of operation, the first cooling circuit 4100, the second cooling circuit 4200, and the third cooling circuit 4300 as described above with respect to the incremental, mechanical-assist mode of operation continue to remain in operation while the fourth cooling circuit 4400 is placed into operation to permit incremental, additional cooling of the modular data pods 50, 60, 70, 80, 90, 100, or 80' such that the cooling capacities of the first, second, third, and fourth cooling circuits 4100, 4200, 4300, and 4400, respectively, are adjusted incrementally depending on the increase or decrease in heat load from the modular data pods 50, 60, 70, 80, 90, 100, or 80' and/or any increase in environmental conditions based on the wet-bulb temperature.

The cooling system 4000 has many significant advantages over traditional cooling systems, such as chilled water systems, chiller plants, or direct expansion cooling systems. First, the cooling system 4000 requires far less mechanical-assisted cooling infrastructure than traditional cooling systems. The cooling system 4000 increases its use of mechanical-assisted cooling infrastructure only when necessary. Specifically, the cooling system 4000 has two basic circuits, i.e., the first circuit 4100 and the second circuit 4200, which run constantly, and two backup circuits, i.e., the third circuit 4300 and the fourth circuit 4400, which run only when necessary. Specifically, the third circuit 4300 is active only when the wet-bulb temperature is above the threshold temperature, and the fourth circuit 4400 is active only when the first fluid liquid level is low or the first fluid temperature is above a certain threshold. Since the two backup circuits operate only when necessary, e.g., approximately 10-20% of the operating time, the cooling system 4000 overall relies on less mechanical-assisted cooling infrastructure than the traditional cooling system.

Second, the cooling system 4000 is less prone to failures than the traditional cooling system. Specifically, the cooling system 4000 completely avoids a full system swing over process that is common in the traditional cooling system. A full system swing over process switches between two systems by shutting down one system and starting up another, which typically happens when the traditional cooling system switches between a free cooling system and a mechanical cooling system. The full system swing over process is dangerous and prone to failures. The cooling system 4000, on the other hand, avoids the full system over process. In the cooling system 4000, the basic circuits and the backup circuits run independently, yet cooperating with each other. The basic circuits 4100 and 4200 run continuously regardless of the state of the backup circuits 4300 and 4400. The backup circuits 4300 and 4400 are turned on only when necessary. Accordingly, the cooling system 4000 avoids the failures in the full system swing over process, and is a safer approach than the traditional cooling system.

Third, the cooling system 4000 has a higher tolerance for high wet-bulb temperatures than the traditional cooling system. The traditional cooling system generally has a very high operation cost when the wet-bulb temperature is above 10° C. For instance, the maximum wet-bulb temperature that the traditional cooling system can survive in a free-cooling mode is approximately 10° C. When the wet-bulb temperature exceeds 10° C., the traditional cooling system must switch from a free cooling system to a mechanical cooling system to provide sufficient cooling to an IT data center. For about every half degree above 10° C., the mechanical cooling system has to generate an additional cooling capacity of 320 kW, which demands the traditional cooling system to acquire sufficient power to generate the additional cooling capacity.

On the other hand, the cooling system 4000 of the present disclosure has a better tolerance for high wet-bulb temperatures. In some embodiments, the maximum wet-bulb temperature that the cooling system 4000 can survive in a free-cooling mode is approximately 17.2° C., much higher than that of the traditional cooling system. Once the wet-bulb temperature exceeds 17.2° C., the cooling system 4000 switches to the mechanical compressed cooling mode. For every half degree above 17.2° C., the mechanical compressed cooling mode generates an additional cooling capacity of 45.7 kW, which, in turn, consumes significantly less power than the traditional cooling system. Because of its high tolerance for high wet-bulb temperature, the cooling system 4000 is better suited for a high density IT data center, e.g., 40 kW per rack, than the traditional cooling system.

Fourth, the cooling system 4000 is more energy efficient than the traditional cooling system. The cooling system 4000 maximizes energy savings by having the simple free-cooling mode which relies on atmosphere to assist cooling the IT data center. In the simple free-cooling mode, the cooling system 4000 consumes a limited of power, which, for instance, is 15% less than what is required to power the traditional cooling system. Further, the cooling system 4000 adjusts its power consumption dynamically as a function of the load in the IT data center. As the load increases, the cooling system 4000 increases its power consumption level to cause an increase in the flow rates in the two basic circuits and/or activate one or both of the backup circuits, which, in turn, generate more cooling capacity to compensate for the load increase. By contrast, as the load decreases, the cooling system 4000 decreases its power consumption level which, in turn, reduces its output of cooling capacity.

Fifth, the cooling system 4000 is more scalable to the size of the IT data center and easier deployable than the typical cooling system. For instance, the cooling system 4000 can be deployed modularly at specific, targeted locations in an IT data center, in contrast to the typical cooling system which has to be deployed as a whole covering the full extent of the IT data center. Due to its modularity, the cooling system 4000 targets specific locations in the IT data center and avoids locations that do not need cooling. Also due to its modularity, the cooling system 4000 can be deployed on existing and retrofit cooling systems which the typical cooling system fails to do. Further, the number of cooling systems 4000 deployed in an IT data center may be scaled according to the dynamic change, e.g., shrink or growth, of the IT data center.

Lastly, the cooling system 4000 has a lower overall cost than that of the traditional cooling system. For instance, the cooling system 4000 requires relatively low initial capital and maintenance. Further, due to its energy efficiency, the cooling system 4000 has a low operation cost. As a result, the cooling system 4000 is more cost effective than the traditional cooling system. Because of its overall low cost, in addition to its high tolerance for high wet-bulb temperature, the cooling system 4000 is an optimal cooling choice for the high density IT data center, e.g., 40 kW per rack.

Thus, a control strategy is employed to enable close system pressure and flow tolerances utilizing bypass control valves, temperature and pressure sensors, and receiver safeties and pressure regulators. This control strategy may be executed in real time and is relational with dynamic control of all components. The control strategy incorporates feed back from the IT servers to better facilitate close-coupled cooling based on real-time individual loading of the rack servers and computer loads.

One of the benefits of the dedicated close-coupled cooling systems (e.g., 525) is that they can adapt to the different heat loads that are generated by different servers contained in the modular data pods. As a result, the dedicated close-coupled cooling systems can operate efficiently. In contrast, traditional cooling systems for data centers and data pod modules are typically designed for and operate at the worst case conditions for a particular computer design. Also, traditional cooling systems cool all data pod modules according to the data module with the greatest heat load.

Figure 7:
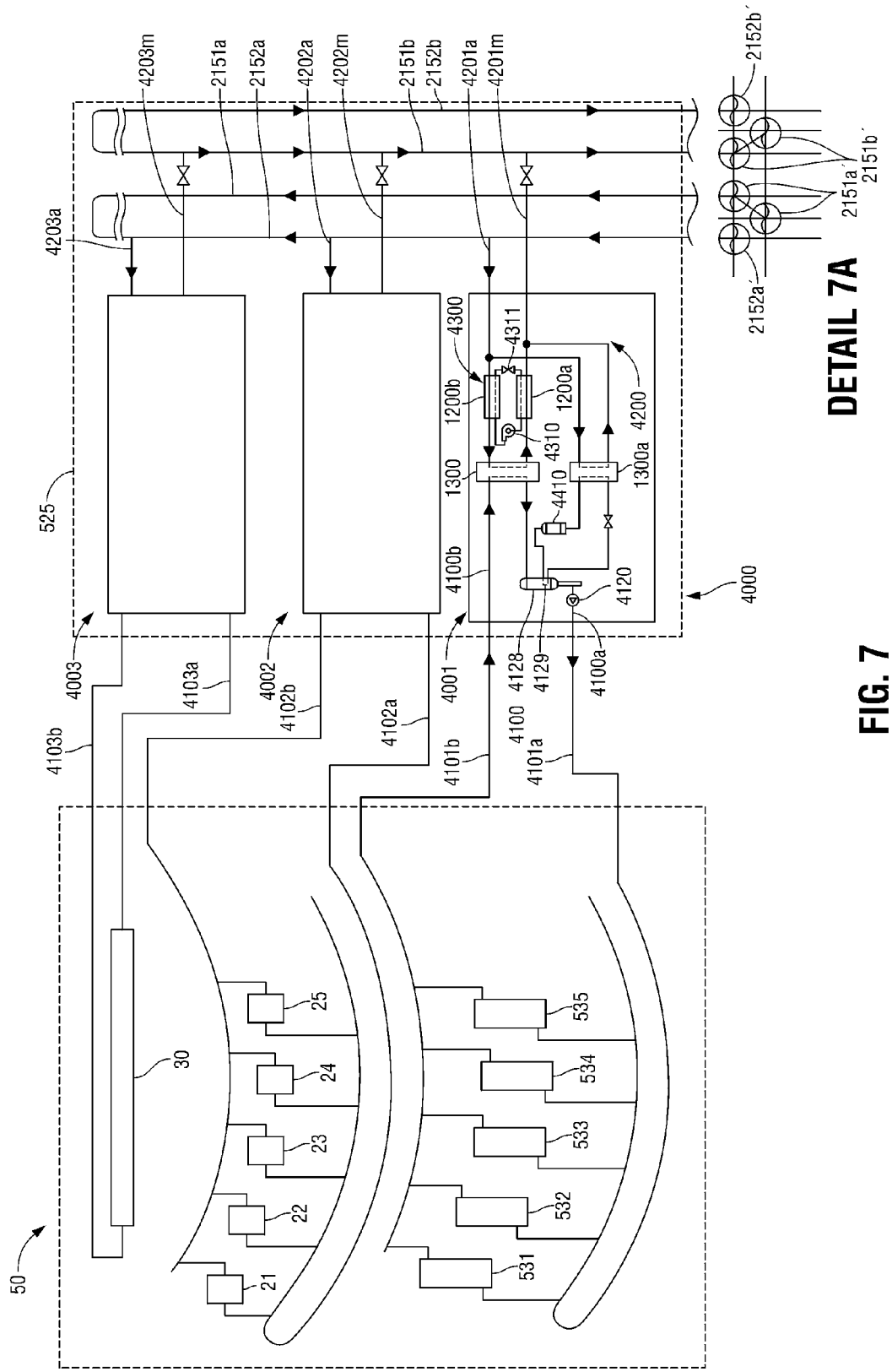
FIG. 7 is a schematic diagram of a refrigerant-cooled cooling system that includes the close-coupled cooling system of FIG. 6 for modular data pods according to embodiments of the present disclosure.

FIG. 7 is a schematic diagram of a dedicated close-coupled hybrid refrigerant-cooled and water-cooled cooling system for modular data pods. In the exemplary embodiment of FIG. 7, dedicated close-coupled hybrid refrigerant-cooled and water-cooled cooling system 525 of FIG. 2A incorporates cooling system 4000 of FIG. 6, which is illustrated as being applied to modular data pod 50 of FIG. 2A in the form of three independent and individually-pumped refrigerant cooling coil circuits 4001, 4002, and 4003.

The dedicated close-coupled cooling system 525, which may allow for chillerless operation, is housed within an auxiliary enclosure or compartment 515, as described above with respect to FIG. 2A. The dedicated close-coupled cooling system 525 includes the three independent and individually-pumped refrigerant cooling coil circuits 4001, 4002 and 4003 that are each similar to the cooling system 4000 of FIG. 6. For the purposes of clarity, the refrigerant cooling coil circuits 4001 are illustrated as simplified versions of the cooling system 4000 of FIG. 6, but may include each of the features of cooling system 4000 of FIG. 6. Those skilled in the art will recognize that cooling circuits 4002 and 4003 also may include each of the features of cooling system 4000 of FIG. 6.

Thus, the cooling circuits 4001, 4002, and 4003 may each include the first cooling circuit 4100, the second cooling circuit 4200, the third cooling circuit 4300, and the fourth cooling circuit 4400 respectively. As described above with respect to FIG. 6, if the wet-bulb temperature is at or exceeds a predetermined wet-bulb temperature limit, the second fluid circuit 4200 is placed into operation to sub-cool the first fluid flowing through the first cooling circuit 4100. Operation of the second fluid circuit 4200 includes operation of the compressor 4310, the sub-cooler exchanger 1200*a* and trim condenser 1200*b*, and the refrigerant fluid receiver 4128 that is designed to provide stable liquid levels at the inlet to liquid refrigerant pump 4120.

The first circuit 4001 includes fluid supply path 4100*a* and fluid return path 4100*b* that are fluidly coupled to primary cooling vertical coils 531 to 535, adjacent to rear sides 501*a* to 505*a* of server racks 501 to 505, respectively. Primary vertical coils 531 to 535 are in fluidic communication with refrigerant gas fluid supply path 4100*a* via first refrigerant cooling gas supply connection header 4101*a*. The refrigerant gas passes through the primary vertical coils 531 to 535 to cool the server racks 501 to 505, respectively. The refrigerant gas is then discharged to refrigerant cooling gas return connection header 4101*b* that is in fluidic communication with the electronic equipment and fluid return path 4100*b* described above with respect to FIG. 6.

The second circuit 4002 includes (N+1) secondary cooling vertical coils 21 and 22 as described above with respect to modular data pod 10 in FIG. 3 plus additional (N+1) vertical cooling coils 23, 24, and 25 that are not explicitly illustrated in FIG. 3. Secondary vertical coils 21 to 25 are in fluidic communication with refrigerant gas fluid supply path 4100*a* via first refrigerant cooling gas supply connection header 4102*a*. The refrigerant gas passes through the secondary vertical coils 21 to 25, which are generally positioned in proximity to server racks 501 to 505 to cool the server racks 501 to 505, respectively. The refrigerant gas is then discharged to refrigerant cooling gas return connection header 4102*b* that is in fluidic communication with the electronic equipment and fluid return path 4100*b* described above with respect to FIG. 6.

Similarly, the third circuit 4003 includes one or more (N+2) cooling coils, such as third cooling coil 30 that is disposed on the suction sides of the air circulators 16a, 16b, 16c for further cooling of the air circulating through the air circulators 16a, 16b, 16c, as described above with respect to FIG. 3. In a similar manner, third cooling coil 30 is in fluidic communication with refrigerant gas fluid supply path 4100a via first refrigerant cooling gas supply connection header 4103a. The refrigerant gas passes through the third cooling coil 30 that is generally positioned above server racks 501 to 505 to cool the server racks 501 to 505, respectively. The refrigerant gas is then discharged to refrigerant cooling gas return connection header 4103b that is in fluidic communication with the electronic equipment and fluid return path 4100b described above with respect to FIG. 6.

In general, in conjunction with FIG. 6, in the initial configuration, the first cooling circuit 4001 is in fluidic communication with the primary vertical cooling coils 531 to 535 and with the cooling water supply header 2152a via the primary cooling coil cooling water supply connection 4201a, which is in fluidic communication with the first low temperature supply path 4200a and via the primary cooling coil cooling water return connection 4200m, which is in fluidic communication with the first high temperature return path 4200m. The primary cooling coil cooling water return connection 4200m is in fluidic communication with a cooling water return header 2151b. The cooling water supply header 2152a may also be in fluidic communication with a second cooling water supply header 2151a. Similarly, the cooling water return header 2151b may also be in fluidic communication with a second cooling water return header 2152b.

As the heat load within the modular data pod 50 increases, the secondary (N+1) vertical cooling coils 21 to 25 can be installed and the second cooling circuit 4002 is connected to the secondary vertical cooling coils 21 to 25 and to the cooling water supply header 2152a via the second cooling coil cooling water supply connection 4202a, which is in fluidic communication with the first low temperature supply path 4200a, and via the second cooling coil cooling water return connection 4202m, which is in fluidic communication with the first high temperature return path 4200m. The second cooling coil cooling water return connection 4202m is in fluidic communication with the cooling water return header 2151b.

As the heat load within the modular data pod 50 further increases, the one or more third (N+2) cooling coils 30 can be installed and the third cooling circuit 4003 is connected to the one or more third cooling coils 30 and to cooling water supply header 2152a via third cooling coil cooling water supply connection 4203a, which is in fluidic communication with the first low temperature supply path 4200a, and via third cooling coil cooling water return connection 4203m which is in fluidic communication with first high temperature return path 4200m. Third cooling coil cooling water return connection 2313b is in fluidic communication with cooling water return header 2151b.

Detail 7A in FIG. 7 illustrates that supply header 2151a can be physically installed with a loop or pipe bend 2151'a to provide a longer total length as compared to the alternate supply header 2152a for the purposes of providing reverse return capability.

Similarly, return header 2151b can be physically installed with a loop or pipe bend 2151b' to provide a longer total length as compared to the alternate return header 2152b for the purposes of providing reverse return capability.

Thus, the first, second, and third cooling circuits 4001, 4002, 4003, respectively, can be installed and operated in a staged or as-needed manner, in a single modular data pod, depending upon the heat load. When the second and third cooling systems 4002 and 4003 are not used, all or a portion of the fourth fluid in the fluid receiver 4128 may change to the vapor state. To counter this occurrence, the fourth circuit 4400, which includes the subcooler condenser 1300a, can be operated to maintain a liquid level in the refrigerant liquid receiver 4128.

The three refrigerant cooling coil circuits 4001, 4002, and 4003 may use R-134a (i.e., 1,1,1,2-Tetrafluoroethane) refrigerant. In other embodiments, one or more of the circuits may use other refrigerants known to those skilled in the art. Each circuit 4001, 4002, and 4003 has its own liquid refrigerant pump 4120. Each circuit may also include a secondary or redundant pump (not shown).

FIG. 7 also shows water-cooled condensers 1300. In other embodiments, the cooling system can use air-cooled condensers or other types of condensers. Each condenser circuit includes energy-efficient controls to maintain, optimize, and manage the refrigerant and cooling water circuits. The cold-water side of the cooling system can use any medium for rejecting heat, e.g., air-cooled systems, cooling towers, fluid coolers, glycol water-cooled system, and geothermal systems.

The control and regulation of the refrigerant temperature is managed by water-regulating valves that regulate the temperature of the liquid refrigerant based on a given set point. The cooling system includes control logic that monitors the interior conditions of the modular data pods and regulates the cooling system output based on the internal temperature and specific rack-loading requirements. The deionized water or refrigerant circuits may each include redundant pumps. The pumps are driven VFDs and are controlled according to various control strategies. The control strategies may incorporate demand loading at the server and rack locations according to cloud-computing technology.

In conjunction with the foregoing discussion of FIGS. 1-7, FIGS. 8A to 8C illustrate one embodiment of a method 4500 of cooling electronic equipment, e.g., servers 5511a . . . 511n and 533a . . . 533n illustrated in and described with respect to FIG. 3, using a first fluid, e.g., a liquid refrigerant R134a or similar refrigerant. The method starts at step 4501. In step 4502, the first fluid is free cooled by enabling heat transfer from the first fluid to a second fluid, e.g., that has been cooled using atmospheric air, as described with respect to FIG. 6, and mechanically cooling the second fluid to the extent that free cooling the first fluid is insufficient to cool the first fluid. The mechanical cooling of the second fluid is a function of the temperature of the second fluid.

In step 4506, the second fluid is cooled before using the second fluid to free cool the first fluid by enabling heat transfer from the second fluid to a third fluid. In step 4508, the third fluid is compressed via sub cooler compressor 4310 in the third circuit 4300 of FIG. 6. In step 4510, the compressed third fluid is condensed by enabling heat transfer from the compressed third fluid to the second fluid via the trim condenser 1200b after using the second fluid to free cool the first fluid. More particularly, the compressed third fluid is condensed by trim condenser 1200b.

In step 4512, the pressure of the condensed third fluid is reduced, e.g., via thermal expansion valve 4311, to reduce the temperature of the third fluid. In step 4514, the wet-bulb temperature of the atmospheric air is sensed. In step 4516, the speed of compressing the third fluid, e.g., via sub cooler compressor 4310, is varied as a function of the sensed wet-bulb temperature to vary the temperature of the second fluid.

In step 4518, the free-cooled first fluid is received in a fluid receiver, e.g., fluid receiver 4128. In step 4520, the liquid level of the first fluid contained in the fluid receiver 4128 is sensed, e.g., via liquid level controller 4127.

In step 4522, the first fluid is mechanically cooled to condense the first fluid when the sensed liquid level in the fluid receiver 4128 falls below a first predetermined level. The mechanical cooling of the first fluid may be performed by fluid circuit 4400 via sub cooler compressor 4410 causing a fourth fluid to flow through sub cooler coil 4129 of the refrigerant liquid receiver 4128 into subcooling condenser 1300*a*. In step 4524, the mechanical cooling is deactivated, e.g., by terminating operation of the sub cooler compressor 4410, when the sensed liquid level in liquid receiver 4128 reaches a second predetermined liquid level that is higher than the first predetermined liquid level.

In step 4526, the first fluid in the fluid receiver 4128 is cooled by enabling heat transfer from the first fluid in the fluid receiver 4128 to a fourth fluid. In step 4528, the fourth fluid is compressed, e.g., via sub cooler compressor 4410. In step 4530, the compressed fourth fluid is compressed by enabling heat transfer from the compressed fourth fluid to the second fluid that has been cooled using atmospheric air. In step 4532, the pressure of the condensed fourth fluid is reduced, e.g., via the fourth fluid exiting the sub cooler condenser 1300*a* to a thermal expansion valve 4420, which expands the fourth fluid back to the sub cooler coil 4129 to reduce the temperature of the fourth fluid.

The first fluid, the third fluid, and the fourth fluid may contain a refrigerant such as R134A and the second fluid contains water, e.g., condenser water, chilled water, or a glycol solution.

The method 4500 may also include sensing the temperature of the free-cooled first fluid in first cooling circuit 4100 and regulating the flow rate of the second fluid in second cooling circuit 4200 as a function of the temperature of the free-cooled first fluid, e.g., via the temperature sensor 4126 detecting the temperature of the first fluid when it exits from the main condenser 1300. The readings of the temperature sensor 4126 reflect the temperature of the main condenser 1300. The method 4500 ends at step 4534.

In yet other embodiments, the systems and methods according to the present disclosure utilize stable temperate-pumped cooling fluid from an external source (independent circuit) to cool the motor inverters on either single compressors or chiller compressors that are operating on another independent circuit. The systems and methods according to the present disclosure could be modified to be used on many complementary systems that utilize a relatively stable or closer tolerance pumped fluid, e.g., water or refrigerant, to be pumped to cool at least one inverter of the variable frequency drive for driving a compressor of the mechanical cooling system. The systems and methods according to the present disclosure not only reduces the required safety "span" or limiting parameters of the compressor, but also eliminates the need for all or a portion of other limiting sensors that are typically included on the systems as protective devices.

The systems and methods according to the present disclosure reduce concerns relating to the dew point temperature by using stable cooling fluids that are well above the dew point temperature. As a result, manufacturers can re-evaluate and lower the low-end lift rating of their compressors. By using the systems and methods according to the present disclosure, this lift rating can approach near 1.0, e.g., about 1.1.

The reduced lift rating enables the compressor to operate at significantly lower kW/ton operating parameters. Because the compressor is allowed to operate under much less stress in a lower work pressure environment, it lowers the overall coefficient of performance.

Figure 9:
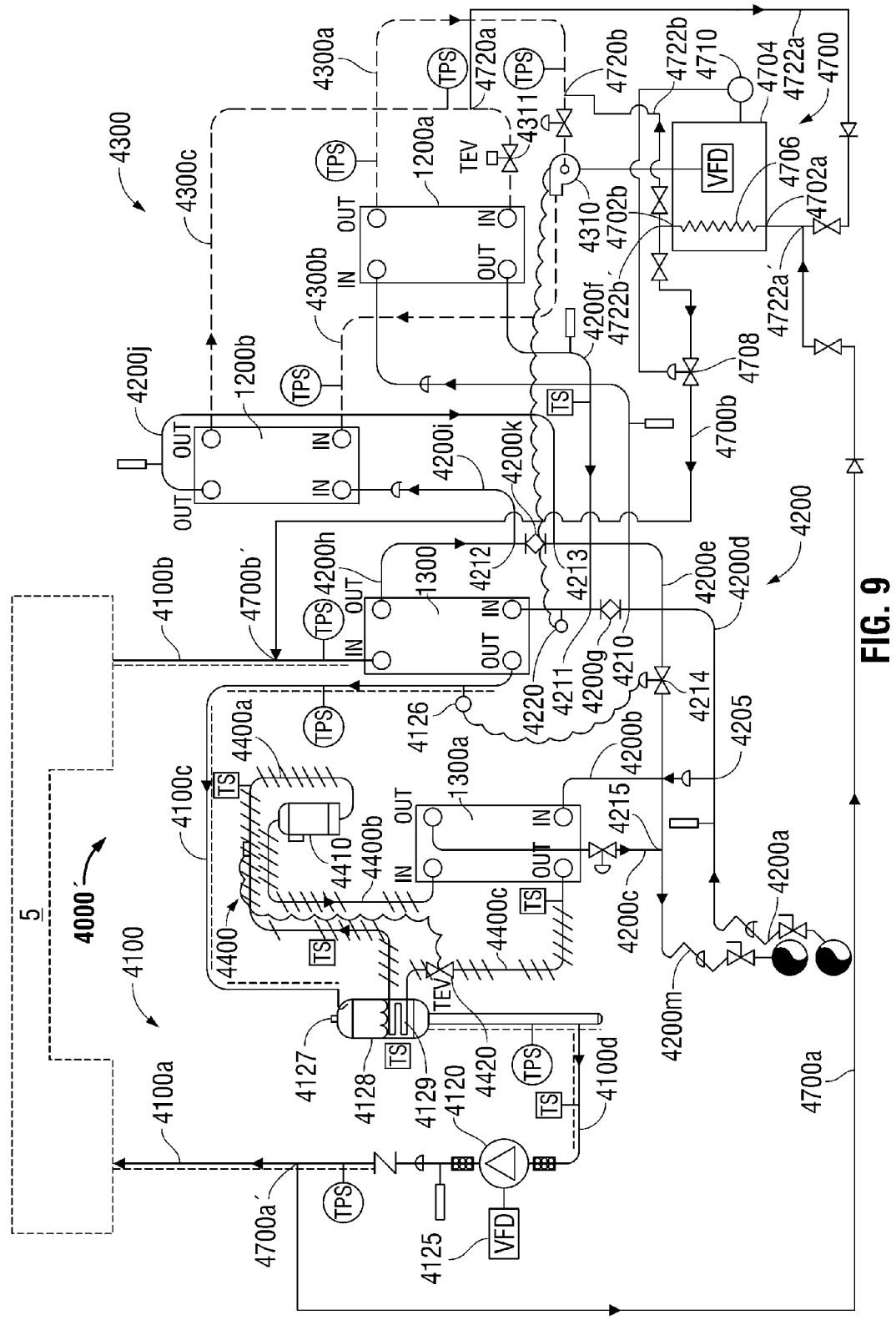
FIG. 9 is an alternate embodiment of the flow diagram of FIG. 6 for a close-coupled cooling system for operation in high wet-bulb temperature applications that includes a system for cooling an inverter of a variable frequency drive of a sub-cooler compressor according to embodiments of the present disclosure.
Figure 10:
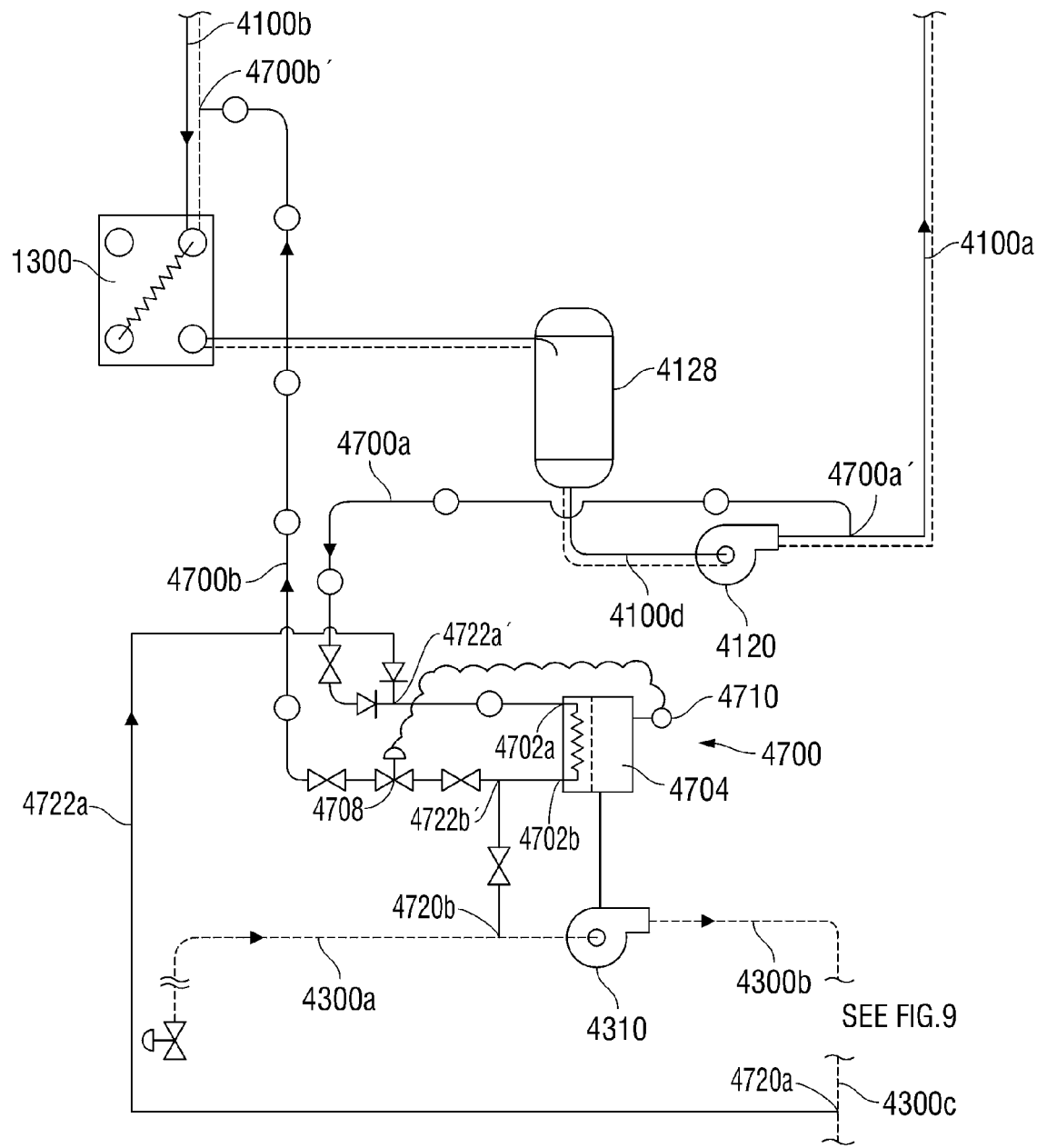
FIG. 10 is a detailed flow diagram of the system for cooling the inverter for a variable frequency drive of a sub-cooler compressor of FIG. 9.
Figure 11A:
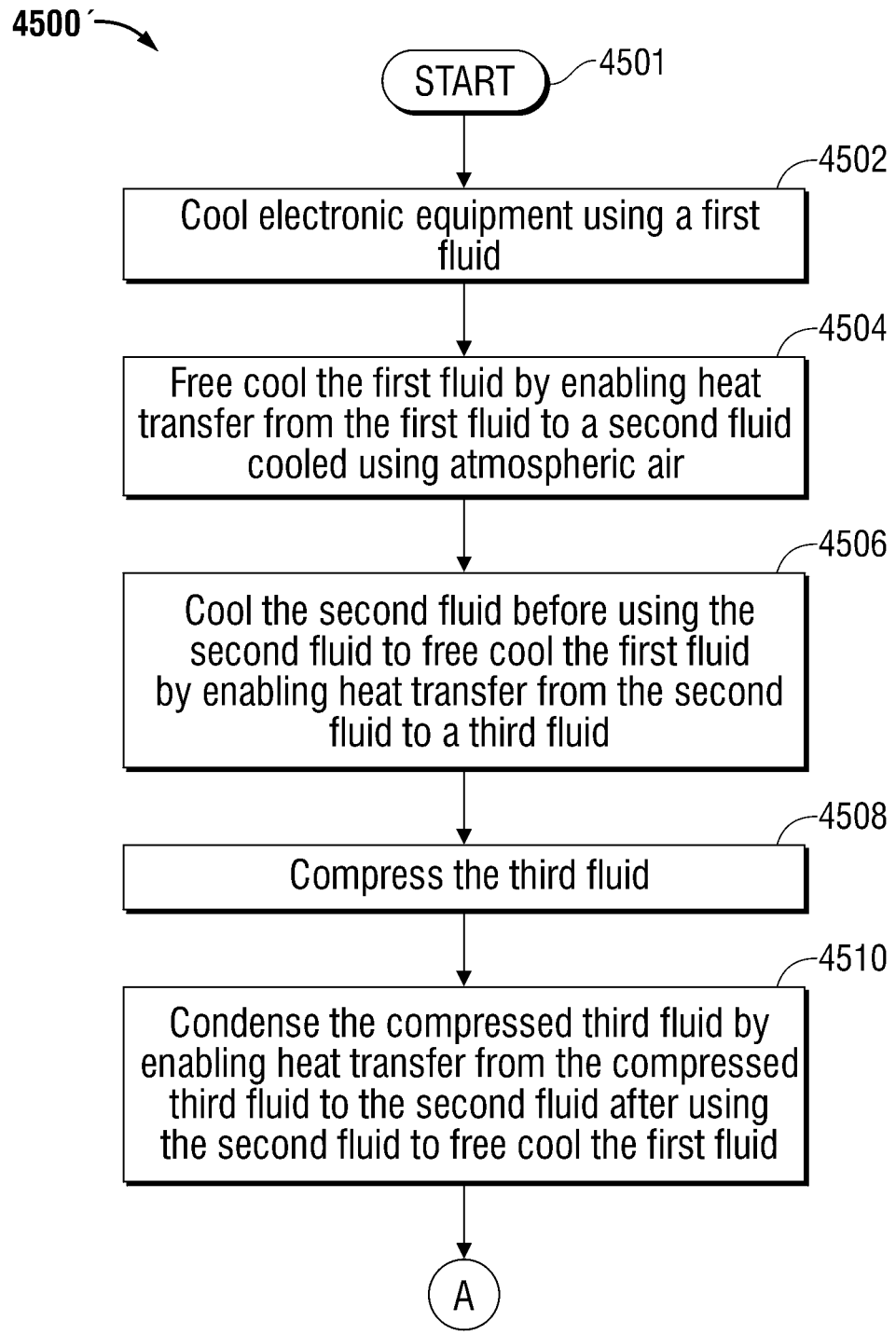
FIGS. 11A-11D are flow diagrams of a method of cooling the inverter for a variable frequency drive of a sub-cooler compressor of FIGS. 9 and 10 in conjunction with the cooling system for electronic equipment of FIG. 6 according to embodiments of the present disclosure.
Figure 11B:
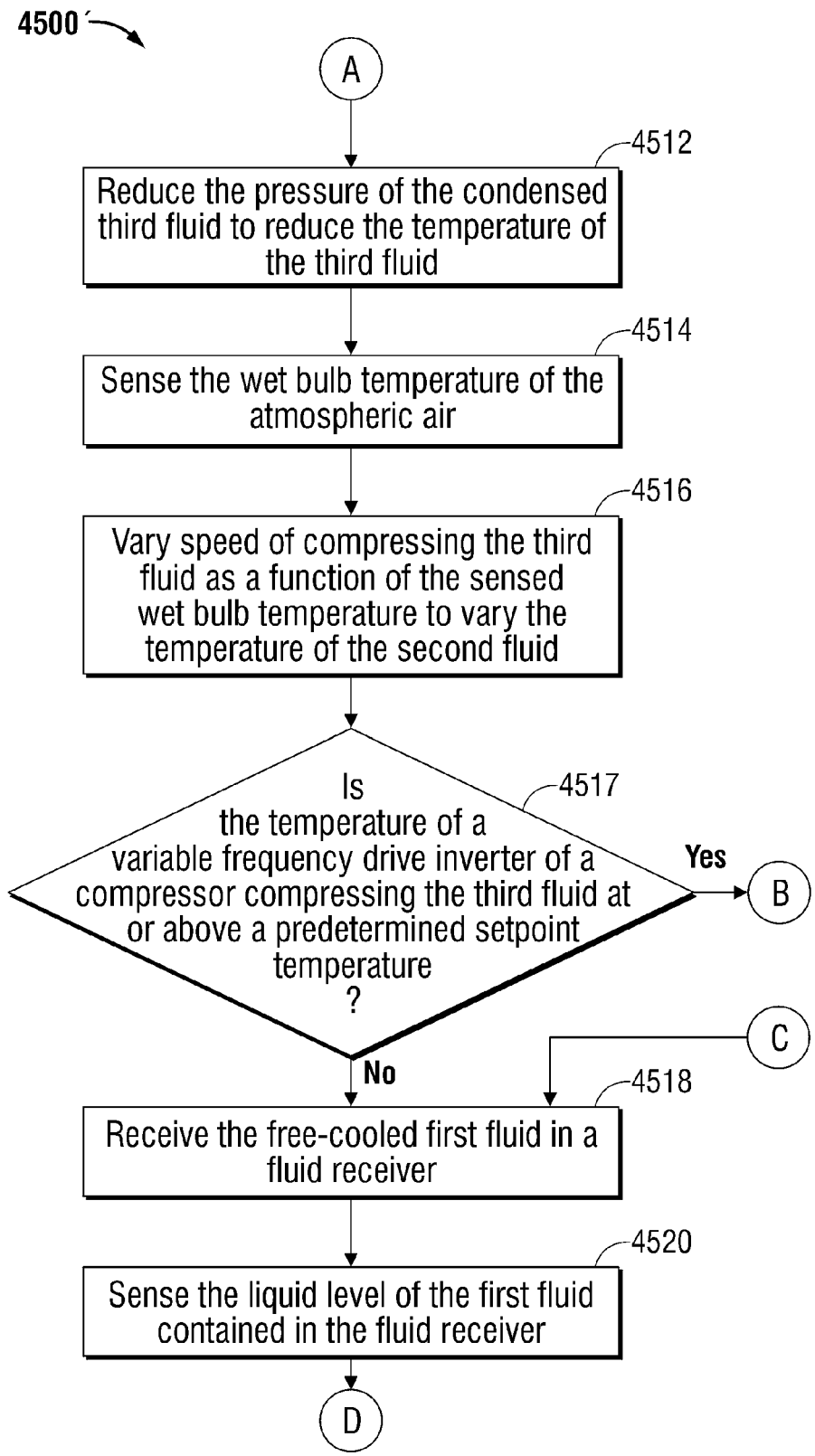
Figure 11C:
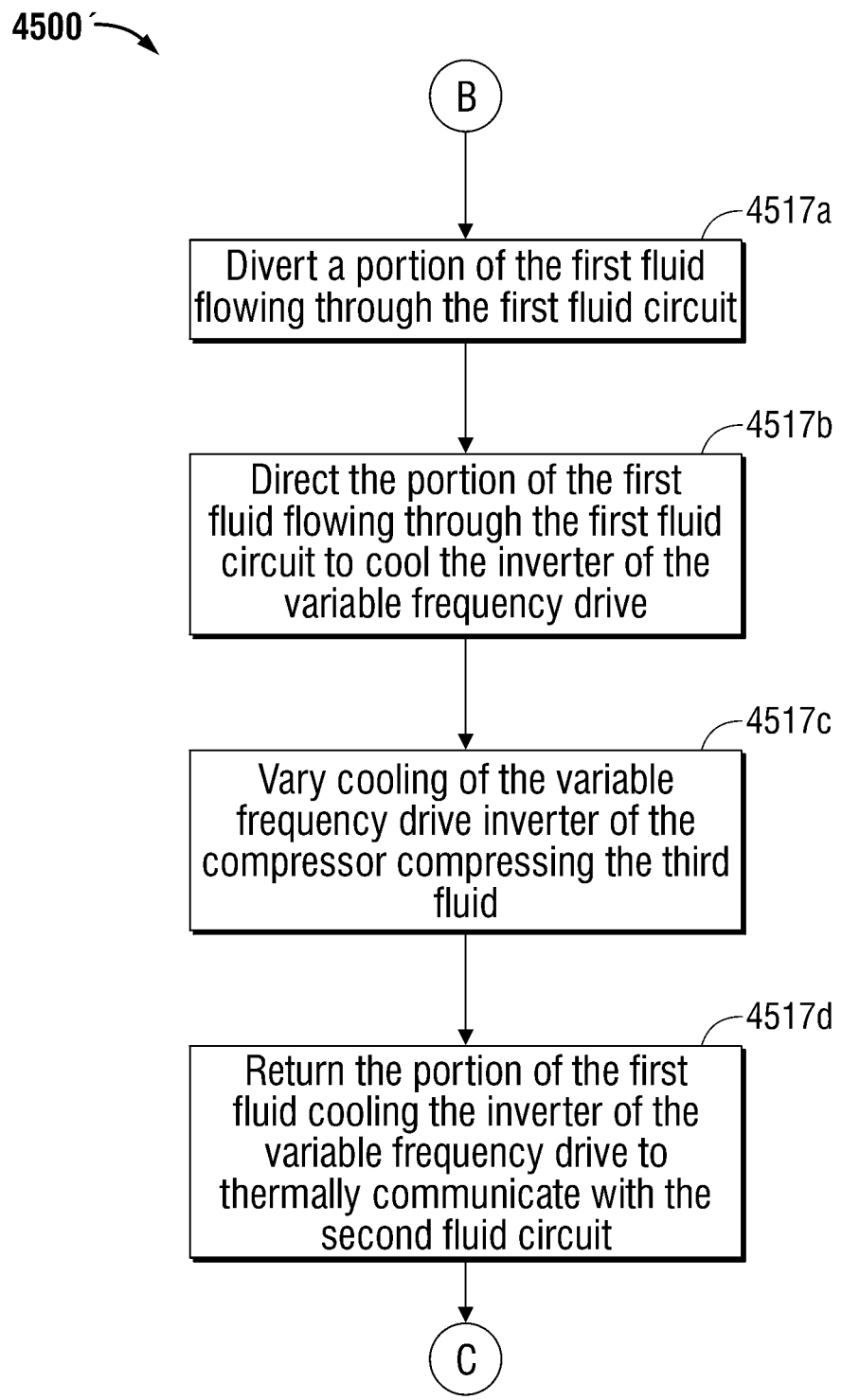
Figure 11D:
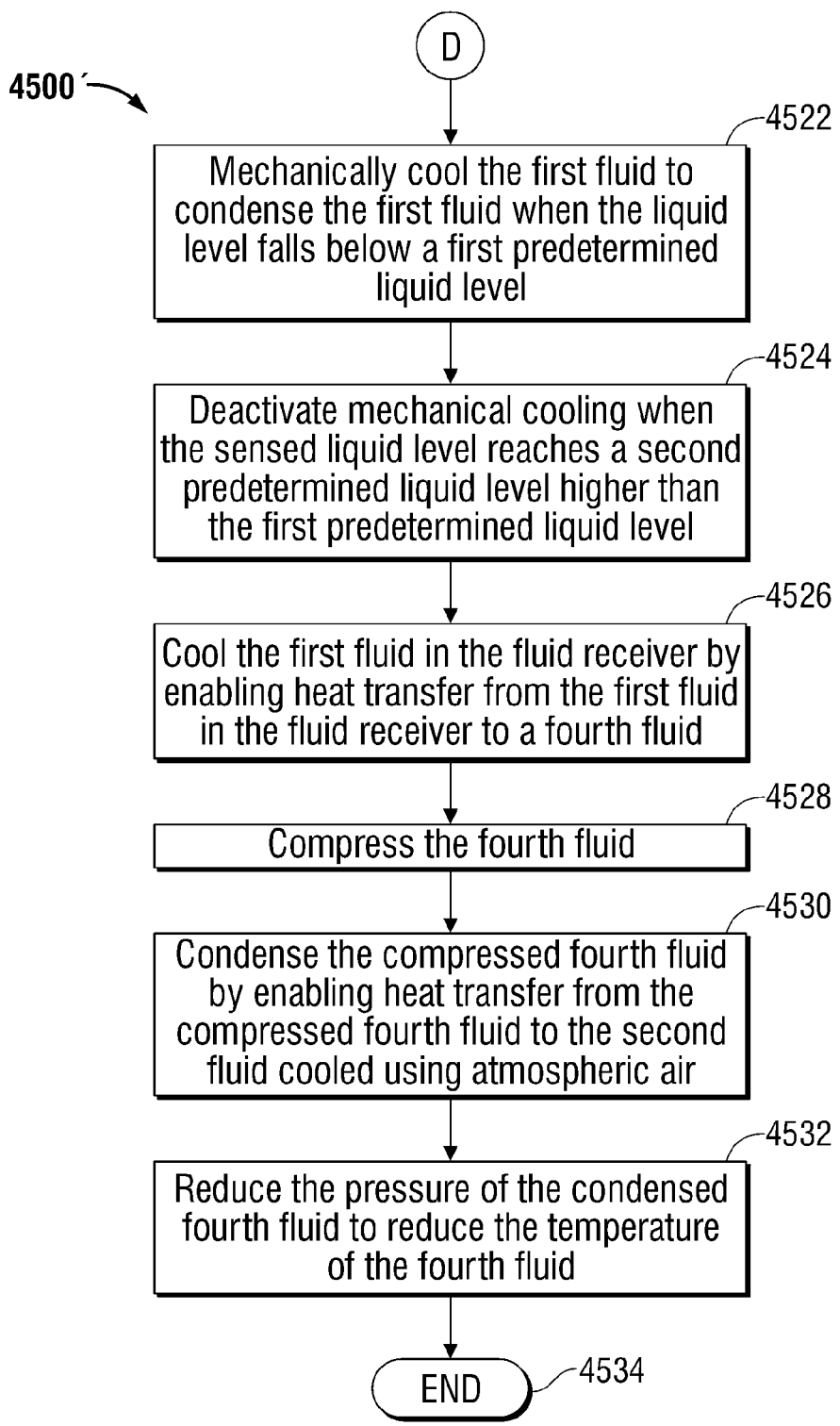

FIGS. 9 and 10 illustrate an inverter cooling system according to embodiments of the present disclosures. The inverter cooling system has much more finite temperature and humidity control aspects enabling it to operate over a greater spectrum of environmental conditions. The inverter cooling system also enables systems to be designed with fewer limiting or safety operating devices because a stable environment is maintained.

The inverter cooling system gains beneficial operating efficiencies by utilizing a constant, stable, and temperate fluid from a first cooling circuit, e.g., a server rack cooling circuit, as a cooling media to support the operation of a second cooling circuit, e.g., an inverter cooling circuit, at much greater efficiencies and tighter tolerances.

The inverter cooling system that can be dynamically controlled to enable it to operate at all times on the sensible side of the psychrometric chart to prevent condensation, which may cause electronics to malfunction.

The inverter cooling system enables manufacturers to expand their operational low-lift ranges to enable lower kW/ton and increase overall energy efficiency. The inverter cooling system also enables chillers to have a more seamless transition from free cooling to mechanical cooling, and vice versa, because it is not dependent on the cold condenser water that would typically be present under these transfer conditions. This allows the free cooling circuit to be enabled over a greater number of hours, which reduces operating costs.

The inverter cooling system significantly reduces the amount of "swing over" failures from free cooling to mechanical cooling. This is the single most common alarm that can occur during swing overs. This condition can expose a site to costly shutdowns and loss of cooling on mission critical sites or potentially life safety cooling systems (in hospitals).

The inverter cooling system according to the present disclosure enables compressor manufactures to re-rate their compressor work duty ratings, which are similar to "lift ratings." This re-rating or lowering of the compressor "work" rating allows the compressors to be safely re-rated at lower lift conditions thereby yielding greater efficiencies and tighter coefficient of performance characteristics. The inverter cooling system also enables compressors to operate for longer periods of time under much less stress. Particular systems having low lift conditions may benefit from this and a compressor's life expectancy may increase.

More particularly, referring now to FIG. 9, there is disclosed an alternate embodiment of the flow diagram of FIG. 6 for a close-coupled cooling system 4000' for operation in high wet-bulb temperature applications. The close-coupled cooling system 4000' differs from the close-coupled cooling system 4000 of FIG. 6 in that the close-coupled cooling system 4000' includes a cooling system 4700 for an inverter included with a variable frequency drive 4702 for a motor of the sub-cooler compressor 4310 according to embodiments of the present disclosure.

The liquid refrigerant being sent to the data center, e.g., data center 10 of FIG. 3, via refrigerant fluid supply path 4100*a*, which is in thermal communication with the environment 5 of the electronic equipment (see FIG. 3), and fluid return path 4100*b*, which is also in thermal communication with the environment 5 of the electronic equipment, has excess cooling capacity which would otherwise be wasted. Via a branch connection at branch point 4700*a'*, inverter cooling supply path 4700*a*, in fluid communication with fluid supply path 4100a of first circuit 4100, diverts the excess capacity liquid refrigerant from first circuit 4100 to refrigerant coolant inlet connection 4702a of inverter heat exchanger 4706, such that the inverter heat exchanger 4706 is in fluid communication with the first circuit 4100 via the fluid supply path 4100a, thereby providing cooling capability to the inverter cooling system 4700.

The liquid refrigerant from the first circuit 4100 flows through the inverter heat exchanger 4706 to refrigerant coolant outlet connection 4702b and returns to first circuit 4100 via inverter cooling return path 4700b. The inverter cooling return path 4700b connects at branch point 4700b' to refrigerant fluid return path 4100b, such that the inverter heat exchanger 4706 is also in fluid communication with the first circuit 4100 via the fluid return path 4100b. In this configuration, cooling capability is provided to the inverter cooling system 4700 via the first circuit 4100.

Thus, compressor 4310 having a motor (not explicitly shown) that drives the compressor 4310 and the variable frequency drive 4704 (which includes an inverter) that drives the motor define a compressor sub-assembly.

In one embodiment, the inverter cooling system 4700 may also include a temperature control valve 4708 disposed in the inverter cooling return path 4700b. A temperature controller 4710, which is in communication with a temperature sensor, is configured to monitor the temperature of the inverter of the variable frequency drive 4704. Upon reaching a high temperature or low temperature set point, the temperature controller 4710 sends a signal to an actuator of the temperature control valve 4708 to either increase or decrease, respectively, liquid refrigerant flow through the inverter heat exchanger 4706.

Generally, when the sub-cooling compressor 4310 is manufactured and supplied with the variable frequency drive 4704, the inverter of the variable frequency drive 4704 is cooled by diverting a portion of the fluid flow from the third circuit 4300, such as via refrigerant supply line 4722a, which connects at branch point 4720a to fluid path 4300c, that carries the third fluid from the trim condenser 1200b to a metering device or the thermal expansion valve 4311. The refrigerant supply line 4722a may intersect the inverter cooling supply path 4700a at branch connection 4722a'. Fluid flow through the refrigerant supply line 4722a is then directed through the inverter heat exchanger 4706 from the refrigerant coolant inlet connection 4702a to refrigerant return line 4722b through refrigerant cooling outlet connection 4702b of the inverter heat exchanger 4706. The refrigerant return line 4722b may intersect the inverter cooling return path 4700b at branch connection 4722b'. Fluid flowing through the refrigerant return line 4722b may be directed back to the third circuit 4300 such as at branch connection 4720b in fluid path 4300a that carries the third fluid from the atmospheric sub-cooler exchanger 1200a to the suction of sub-cooler compressor 4310.

Thus, as can be appreciated by those skilled in the art, cooling of the variable frequency drive 4704 solely via divergence of fluid flow from the third circuit 4300 reduces the refrigeration capacity of the third fluid circuit 4300 and/or provides only a limited cooling capability for cooling the inverter of the variable frequency drive 4704 via the inverter heat exchanger 4706.

In contrast, cooling of the variable frequency drive 4704 through the inverter heat exchanger 4706 via divergence of fluid from the first circuit 4100 according to the embodiments of the present disclosure as described above provides a substantially greater capacity for cooling the inverter of the variable frequency drive 4704 and allows relaxation or removal of the operating safety limits and settings previously necessitated by the exclusive reliance on divergence of refrigerant fluid from the third circuit 4300.

Thus, cooling of the variable frequency drive may be effected in conjunction with the refrigerant supplied to and from the first fluid circuit 4100 and concurrently from the third circuit 4300 or divergence of refrigerant from the third circuit 4300 to the inverter heat exchanger 4706 of the variable frequency drive 4704 may be entirely eliminated.

As a result, the heat exchange capacity of the inverter heat exchanger 4706 that is designed for a variable frequency drive relying only on divergence of refrigerant from the third circuit 4300 may differ significantly from the potential heat exchange capacity of the inverter heat exchanger 4706 if it is designed to at least partially or entirely rely on divergence of refrigerant from the first circuit 4100. The provision of cooling capability to the inverter heat exchanger via the refrigerant liquid fluid supply path 4100a to, and refrigerant fluid return path 4100b from, the first fluid circuit 4100 enables substantially greater heat exchange capacity and provides the benefits described above of reducing the necessary operating limits and settings for the inverter cooling system. The refrigerant is supplied through the refrigerant fluid supply path 4100a as a liquid and is returned via the refrigerant fluid return path 4100b as at least a mixture of gas and liquid, if not entirely as a gas.

Additionally, the inverter of variable frequency drive 4704 and inverter heat exchanger 4706 may be entirely separate components from the compressor 4310 and motor (not shown) or integrated with the compressor 4310 and motor (not shown).

As used herein, the term inverter may refer to a combination of a rectifier and an inverter of a variable frequency drive where alternating current (AC) power from an offsite power grid (not shown) is converted via a rectifier to DC, which is then converted to AC by an inverter, designated as 4704 in FIG. 9, to allow variable speed operation of compressor 4310 via the variable frequency drive (VFD) motor 4702.

As used herein, the term inverter may also refer to an inverter of the variable frequency drive 4704 in FIG. 9, that is supplied DC from a source of DC power such as the dedicated electrical power supply, illustrated as one or more batteries 32 at a lower end 11' of the data pod enclosure 105 of modular data pod 10 in FIG. 3 to allow variable speed operation of the compressor 4310 via the VFD 4704.

Additionally, as used herein, a variable frequency drive refers also to an adjustable speed drive (ASD), an adjustable frequency drive (AFD), a variable speed drive (VSD), an AC drive, a microdrive or an inverter drive or other similar terminology used in the art.

FIGS. 11A to 11D are flow diagrams of a method 4500' of cooling the inverter for the variable frequency drive 4704 of sub-cooler compressor 4310 of FIGS. 9 and 10 in conjunction with the cooling system for electronic equipment of FIG. 6 according to embodiments of the present disclosure.

The method 4500' is identical to method 4500 of cooling electronic equipment described above with respect to FIGS. 8A-8C except that method 4500' includes, following method step 4516, a decision step 4517 wherein it is determined if the temperature of a variable frequency drive inverter, e.g., variable frequency drive 4704 in FIGS. 9 and 10, of a compressor, e.g., compressor 4310 in FIGS. 9 and 10, compressing the third fluid at or above a predetermined setpoint temperature. (Only those portions of method 4500' which differ from method 4500 will be described).

If the temperature of the variable frequency drive inverter of the compressor compressing the third fluid is at or above a predetermined setpoint temperature, i.e., the response is YES, step 4517a includes diverting at least a portion of the first fluid flowing through the first fluid circuit.

Step 4517b includes directing at least a portion of the first fluid flowing through the first fluid circuit to cool the inverter of the variable frequency drive, e.g., variable frequency drive 4704.

Step 4517c may include, as required by the environmental and operating conditions of the cooling system 4000' in FIGS. 9 and 10, varying cooling of the variable frequency drive inverter, e.g., variable frequency drive 4704 in FIGS. 9 and 10, of the compressor, e.g., compressor 4310.

Step 4517d may include returning the at least a portion of the first fluid cooling the inverter of the variable frequency drive, e.g., variable frequency drive 4704, to thermal communication with the second fluid circuit.

Step 4518 then includes receiving the free-cooled first fluid in a fluid receiver, e.g., fluid receiver 4128 in FIGS. 9 and 10.

Figure 8A:
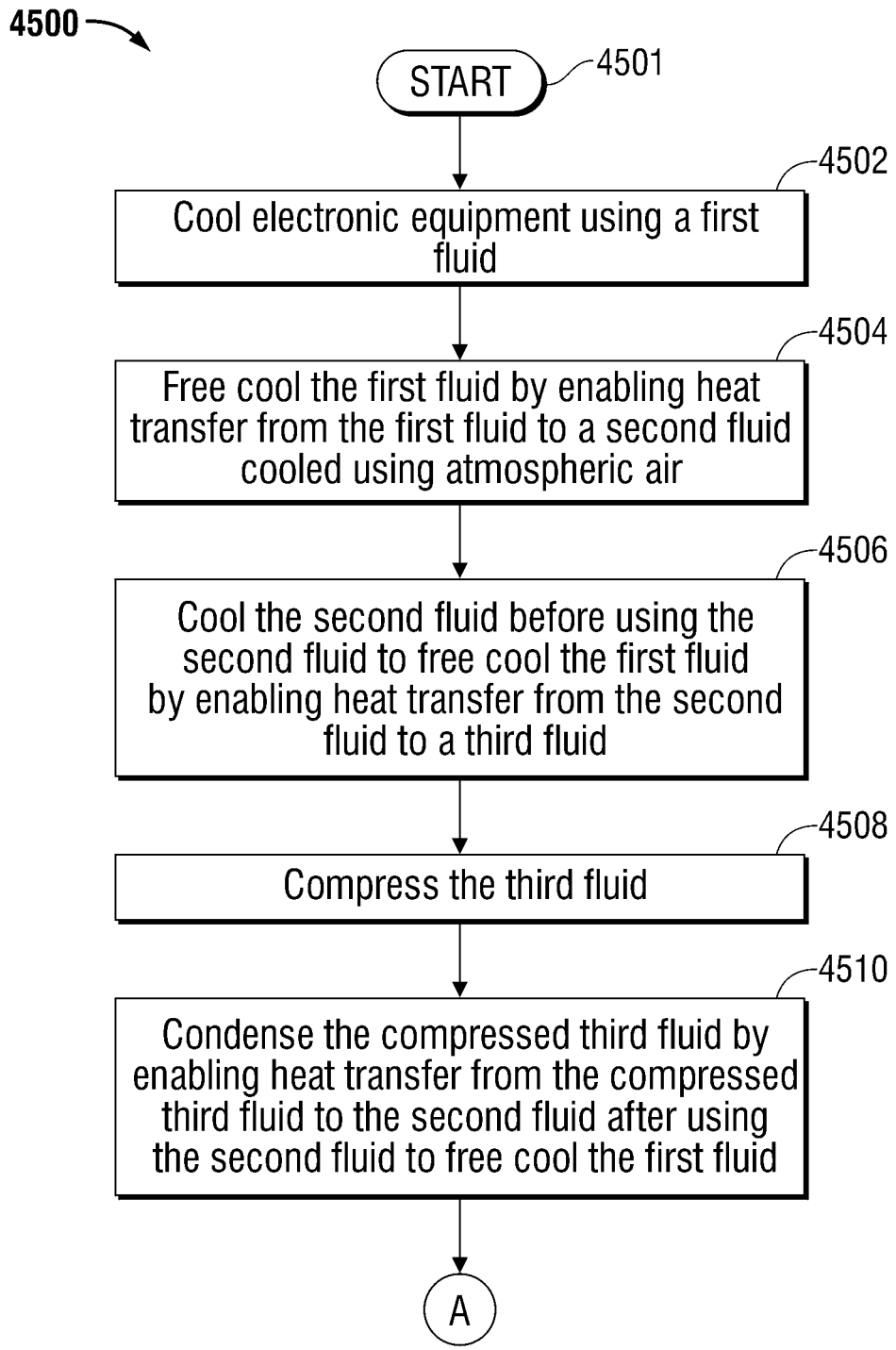
FIGS. 8A-8C are flow diagrams of a method of cooling electronic equipment according to embodiments of the present disclosure.
Figure 8B:
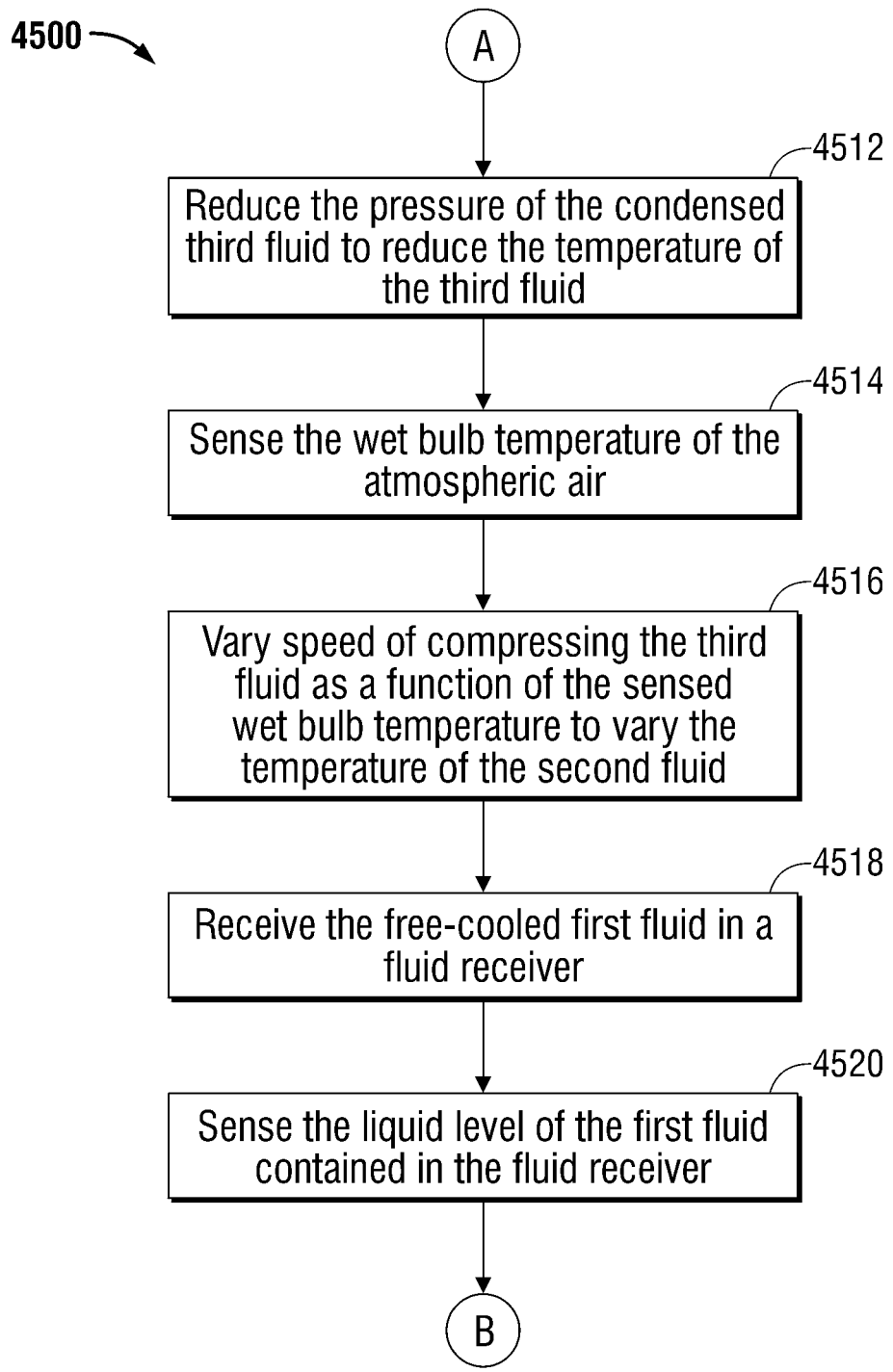
Figure 8C:
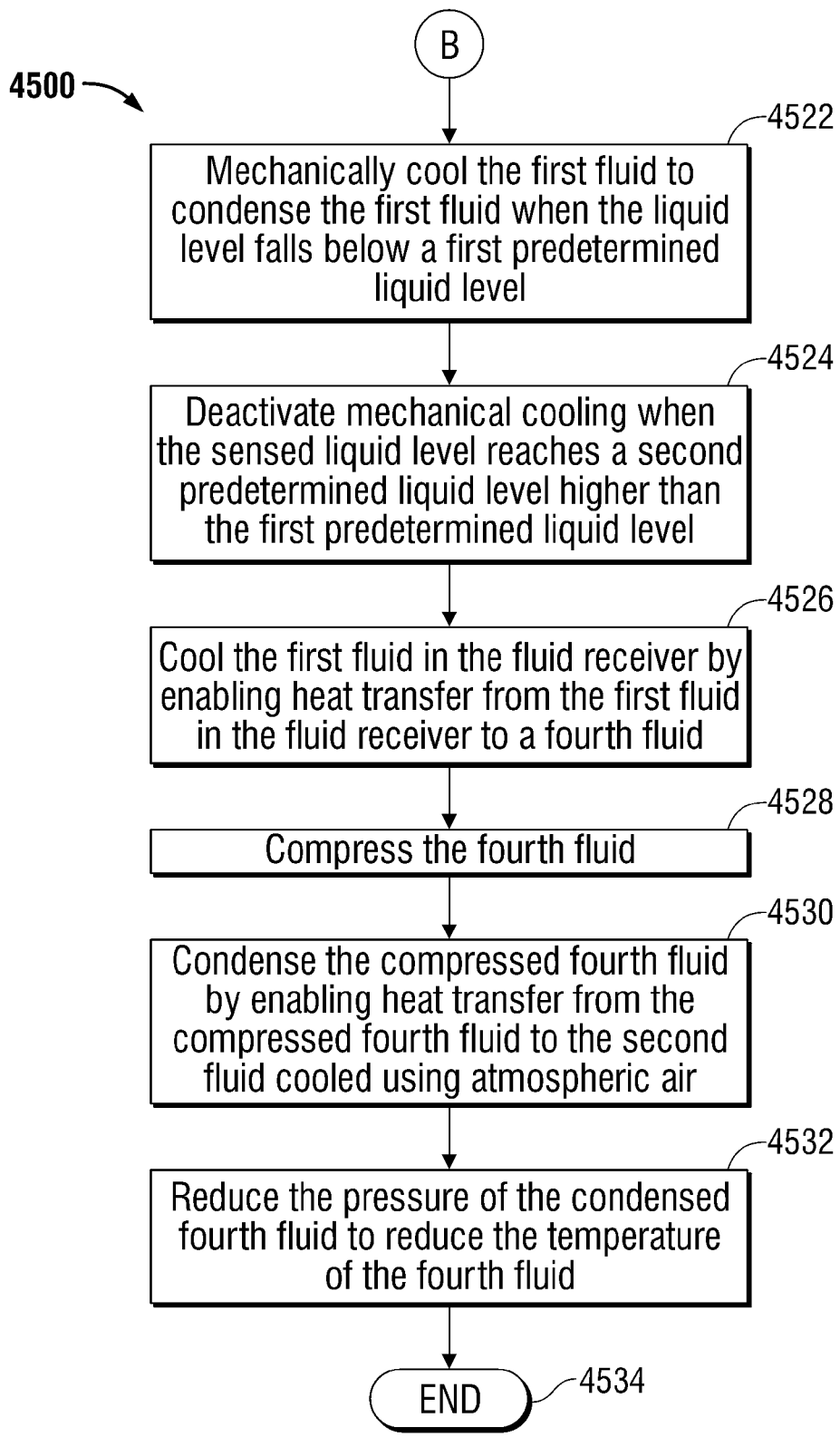

The remainder of the steps, e.g., steps 4520 through 4532, are then implemented in the same manner as described above with respect to method 4500 illustrated in FIGS. 8A to 8C.

Returning to the decision step 4517, if the temperature of a variable frequency drive inverter, e.g., variable frequency drive 4704, of a compressor, e.g., compressor 4310 in FIGS. 9 and 10, compressing the third fluid is NOT at or above a predetermined setpoint temperature, i.e., the response is NO, then steps 4517a through 4517d are bypassed and the method continues directly to step 4518 that includes receiving the free-cooled first fluid in a fluid receiver, e.g., fluid receiver 4128 in FIGS. 9 and 10.

The remainder of the steps, e.g., steps 4520 through 4532, are then again implemented in the same manner as described above with respect to method 4500 illustrated in FIGS. 8A to 8C.

Figure 12:
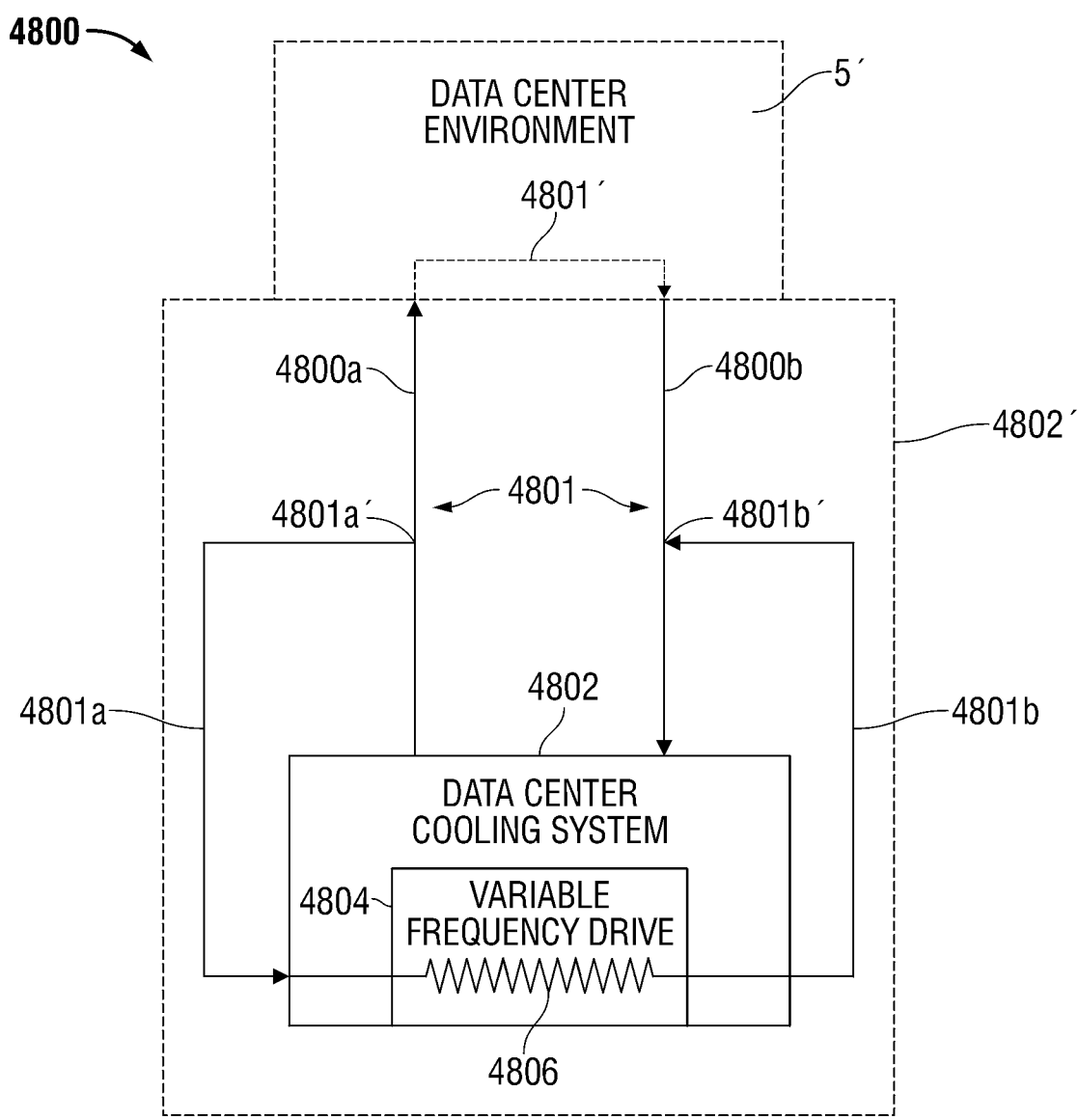
FIG. 12 is block diagram of a generalized cooling system cooling the environment of a generalized data center that includes at least one variable frequency drive and a cooling system for an inverter for a variable frequency drive according to embodiments of the present disclosure.

FIG. 12 is block diagram of a generalized cooling system cooling the environment of a generalized data center that includes at least one variable frequency drive and a cooling system for an inverter for a variable frequency drive according to embodiments of the present disclosure.

More particularly, generalized data center 4800 includes a data center environment 5' in which heat is generated by a plurality of servers during operation of the servers. A data center cooling system 4802 provides cooling to the data center environment 5' via a fluid cooling circuit 4801 having a cooling supply path 4800a to the environment 5' and a cooling return path 4800b to form a cooling circuit with the data center cooling system 4802.

The data center cooling system 4802 includes a variable frequency drive 4804 which is cooled by variable frequency drive heat exchanger 4806. To provide cooling to the variable frequency drive 4804 according to embodiments of the present disclosure, at least a portion of the fluid flowing through fluid cooling supply path 4800a is diverted, at branch point 4801a', to inverter cooling supply path 4801a and directed through the variable frequency drive heat exchanger 4806 to cool the variable frequency drive (including an inverter) 4804.

After cooling the variable frequency drive (including an inverter) 4804, the at least a portion of the fluid directed through the variable frequency drive heat exchanger 4806 is returned to the data center cooling circuit 4801 via inverter cooling return path 4801b to thermally communicate with the data center cooling system 4802.

Thus, it can be seen that the inverter cooling system and method described above with respect to FIGS. 9, 10 and 11A-11D may be applied also to a generalized data center and generalized data center cooling system. In addition, the inverter cooling system and method described above with respect to FIGS. 9, 10 and 11A-11D may also be applied in the same manner to a generalized data center cooling system in which the variable frequency drive 4804 includes a self-contained cooling system such as self-contained cooling system 4720 as illustrated in FIGS. 9 and 10.

Thus, the systems and methods according to the present disclosure utilize a small portion of pumped refrigerant from the liquid system and deliver it in very close temperature and flow rates to the motor inverter on the compressed cooling circuits. By utilizing this fluid, which would not normally be used for this purpose, the systems and methods according to the present disclosure are able to provide the inverter a stable temperate flow in very close tolerances. The ability to provide the inverter with such close tolerance "optimum" fluid temperatures enables the compressor manufacturer to remove many of the "limiting" safety parameters that have been included both in the software as well in some cases hard wired limiting devices with restrictive set points.

In addition, the systems and methods of the present disclosure described in FIGS. 6, 8A-8C, 9, 10 and 11A-11D differ from the prior art in that reference basis heat load which is controlled by the close coupled cooling system 4000 or 4000' is the heat load imposed on the data center by the atmospheric conditions, which a particular data center is encountering, as opposed to the reference basis heat load being the heat load generated by the data center itself, as is the case for prior art data center cooling systems.

The systems and methods of the present disclosure described in FIGS. 6, 8A-8C, 9, 10 and 11A-11D differ from the prior art in that the atmospheric sub-cooler exchanger 1200a and the trim condenser 1200b are fluidically coupled to each other in series, e.g., fluid path 4300a that carries the third fluid from the atmospheric sub-cooler exchanger 1200a to the sub-cooler compressor 4310 is fluidically coupled to trim condenser 1200b via second fluid path 4300b. The trim condenser 1200b is then fluidically coupled in series to atmospheric sub-cooler exchanger 1200a via the third fluid path 4300c.

More particularly, referring to FIG. 6 and FIG. 9, first fluid circuit 4100 is in thermal communication with electronic equipment, e.g., the electronic equipment in environment 5, and is coupled to a first fluid path through a first heat exchanger, e.g., the path formed from IN to OUT by fluid path 4100b to fluid path 4100c in main condenser 1300. Second fluid circuit 4200 is in thermal communication with atmospheric air and is coupled to a second fluid path through the first heat exchanger, e.g. the path formed from IN to OUT by fluid path 4200d to fluid path 4200h through main condenser 1300, to enable heat transfer from the first fluid circuit 4100 to the second fluid circuit 4200.

A first fluid path through a second heat exchanger, e.g., the path formed from IN to OUT by fluid path 4200h, diverted at splitter tee 4212, to fluid path 4200i to fluid path 42011j through trim condenser 1200b, is coupled to an output of the second fluid path through the first heat exchanger, e.g., fluid path 4200j is coupled to fluid path 4200e at splitter tee 4213 wherein fluid path 4200e is an output (OUT) of the main condenser 1300.

A first fluid path through a third heat exchanger, e.g., the path formed from IN to OUT by fluid path 4200e from splitter tee 4210 to fluid path 4200f through atmospheric sub-cooler exchanger 1200a, is coupled to an input of the second fluid path through the first heat exchanger, e.g., first fluid path 4200f is coupled via splitter tee 4213 to the input IN of the second fluid path from IN to OUT by fluid path 4200f to fluid path 4200h of main condenser 1300.

A second fluid path through the second heat exchanger, e.g., the path formed from IN to OUT by fluid 4300b to fluid path 4300c through the trim condenser 1200b, is coupled in series to a second fluid path through the third heat exchanger, e.g., the path formed from IN to OUT by fluid path 4300c to fluid path 4300a through atmospheric sub-cooler 1200a.

Compressor 4310 in the second fluid path through the third heat exchanger, e.g., the path formed from IN to OUT by fluid path 4300c to fluid path 4300a through atmospheric sub-cooler 1200a, is coupled to the second fluid path through the second heat exchanger, e.g., the path formed from IN to OUT by fluid path 4300b on the compressor discharge to fluid path 4300c through trim condenser 1200b, to form third fluid circuit 4300.

Heat exchanger 4706 of the inverter of variable frequency drive 4704 is configured to drive the compressor 4310. The heat exchanger 4706 of the inverter is coupled to the first fluid circuit 4100 to cool the heat exchanger of the inverter via the first fluid circuit 4100. Since the refrigerant in fluid supply path 4100a is supplied as a liquid and returns from the data center 5 at least partially vaporized as a gas in a gas-liquid mixture, there is excess cooling capacity available for cooling the heat exchanger 4706 of the inverter. In addition, since the first fluid circuit 4100 operates at a higher temperature as compared to the third fluid circuit 4300, the dew point temperature within the inverter is increased when the first fluid circuit 4100 is employed for cooling. The speed of the compressor may thus be reduced, thereby increasing power efficiency. Reduction in harmonic distortion is also achieved by the inverter cooling utilizing the first circuit 4100.

In contrast, in prior art trim cooling systems, any atmospheric sub-cooler exchanger or trim condenser are coupled in parallel with respect to the third cooling circuit. It is the series coupling of the atmospheric sub-cooler exchanger 1200a to the trim condenser 1200b according to the embodiments of the present disclosure which provides a significant reduction in power requirements for operation of the third circuit 4300 as compared to the prior art.

In addition, due to the reduction in cooling water requirements for a data pod farm such as the data pod farm 1400 described above with respect to FIG. 1, only a single condenser pump located at the cooling towers is required to pump water through the entire data farm 1400 because of the reduction in cooling water requirements.

While several embodiments of the disclosure have been shown in the drawings and/or described in the specification, it is not intended that the disclosure be limited to these embodiments. It is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims set forth below.

What is claimed is:

1. A cooling system for cooling an inverter of a variable frequency drive, the cooling system comprising:
 a first fluid circuit configured to cool electronic equipment using a first fluid flowing through the first fluid circuit;
 a second fluid circuit configured to free cool a second fluid flowing through the second fluid circuit, the second fluid circuit further configured to cool the first fluid using the free-cooled second fluid; and
 a third fluid circuit configured to mechanically cool the second fluid using a third fluid flowing through the third fluid circuit as a function of a difference between a wet bulb temperature of atmospheric air and a first predetermined wet bulb temperature when the wet bulb temperature exceeds the first predetermined wet bulb temperature, the third fluid circuit including at least one compressor that compresses the third fluid, the at least one compressor being driven by a motor coupled to the variable frequency drive,
 wherein at least a portion of the first fluid flowing through the first fluid circuit is directed to cool the inverter of the variable frequency drive.

2. The cooling system according to claim 1, wherein at least a portion of the first fluid cooling the inverter of the variable frequency drive is returned such that the at least a portion of the first fluid is in thermal communication with the second fluid flowing through the second fluid circuit.

3. The cooling system according to claim 1, wherein the first fluid circuit includes a fluid receiver, further comprising:
 a sensor configured to sense a liquid level of the first fluid contained in the fluid receiver; and
 a fourth fluid circuit in thermal communication with the first fluid contained in the fluid receiver, the fourth fluid circuit configured to mechanically cool and condense the first fluid when the sensed liquid level falls below a predetermined liquid level.

4. The cooling system according to claim 1, wherein the first fluid and the third fluid include a refrigerant and the second fluid includes water.

5. The cooling system according to claim 3, wherein a mechanical sub-cooling system is closely coupled to the electronic equipment.

6. A system for cooling electronic equipment, comprising:
 a free-cooling system configured to cool a first fluid in thermal communication with electronic equipment using atmospheric air, the free-cooling system comprising:
  a free-cooling device configured to cool a second fluid using atmospheric air; and
  a main heat exchanger in fluid communication with the free-cooling device, the main heat exchanger configured to enable heat transfer from the first fluid to the second fluid; and
 a mechanical sub-cooling system coupled to the free-cooling system, the mechanical sub-cooling system configured to cool a second fluid flowing in the free-cooling system as a function of an amount by which the free-cooling system has exceeded a predetermined cooling capacity, the mechanical sub-cooling system comprising:
  a first heat exchanger that enables heat transfer from the second fluid flowing into the main heat exchanger to a third fluid flowing through the first heat exchanger;
  a compressor subassembly comprising:
   a compressor in fluid communication with the first heat exchanger and configured to compress the third fluid flowing out of the first heat exchanger;
   a motor that drives the compressor; and
   a variable frequency drive that drives the motor; and
  a second heat exchanger in fluid communication with the compressor and enables heat transfer from the compressed third fluid to the second fluid flowing out of the main heat exchanger; and
 a variable frequency drive cooling system configured to cool the variable frequency drive using at least a portion of the first fluid flowing out of the main heat exchanger.

7. A method of assembling a system for cooling electronic equipment, the method comprising:
 coupling a first fluid circuit that is in thermal communication with electronic equipment to a first fluid path through a first heat exchanger;

coupling a second fluid circuit that is in thermal communication with atmospheric air to a second fluid path through the first heat exchanger to enable heat transfer from the first fluid circuit to the second fluid circuit;

coupling a first fluid path through a second heat exchanger to an output of the second fluid path through the first heat exchanger;

coupling a first fluid path through a third heat exchanger to an input of the first fluid path through the first heat exchanger;

coupling in series a second fluid path through the second heat exchanger to a second fluid path through the third heat exchanger;

coupling a compressor in the second fluid path through the third heat exchanger to the second fluid path through the second heat exchanger to form a third fluid circuit; and coupling a heat exchanger of an inverter of a variable frequency drive configured to drive the compressor to the first fluid circuit to cool the heat exchanger of the inverter via the first fluid circuit.

8. The method according to claim 7, further comprising coupling the inverter heat exchanger to the third fluid circuit.

9. A system for cooling a variable frequency drive for driving a compressor of a cooling system for electronic equipment, the system comprising:
a first fluid circuit that is in thermal communication with electronic equipment, coupled to a first fluid path through a first heat exchanger;
a second fluid circuit that is in thermal communication with atmospheric air coupled to a second fluid path through the first heat exchanger to enable heat transfer from the first fluid circuit to the second fluid circuit;
a first fluid path through a second heat exchanger coupled to an output of the second fluid path through the first heat exchanger;
a first fluid path through a third heat exchanger coupled to an input of the first fluid path through the first heat exchanger;
a second fluid path through the second heat exchanger coupled in series to a second fluid path through the third heat exchanger;
a compressor in the second fluid path through the third heat exchanger coupled to the second fluid path through the second heat exchanger to form a third fluid circuit; and
a heat exchanger of an inverter of a variable frequency drive configured to drive the compressor, the heat exchanger of the inverter coupled to the first fluid circuit to cool the heat exchanger of the inverter via the first fluid circuit.

10. A method of cooling electronic equipment, comprising:
cooling electronic equipment using a first fluid;
free cooling the first fluid by enabling heat transfer from the first fluid to a second fluid that has been cooled using atmospheric air; and
mechanically cooling the second fluid,
wherein mechanically cooling the second fluid includes:
cooling the second fluid before using the second fluid to free cool the first fluid by enabling heat transfer from the second fluid to a third fluid;
compressing the third fluid using a compressor including a variable frequency drive, the compressor being configured to cool an inverter of the variable frequency drive;
condensing the compressed third fluid by enabling heat transfer from the compressed third fluid to the second fluid after using the second fluid to free cool the first fluid;
reducing a pressure of the condensed third fluid to reduce a temperature of the third fluid; and diverting at least a portion of the first fluid to enable heat transfer from the inverter of the variable frequency drive to the first fluid.

11. The method according to claim 10, further comprising returning the at least a portion of the first fluid cooling the inverter of the variable frequency drive to thermal communication with a second fluid circuit configured to free cool the second fluid flowing through the second fluid circuit.

12. The method according to claim 10, wherein mechanically cooling the second fluid further includes mechanically cooling the second fluid to the extent that free cooling the first fluid is insufficient to cool the first fluid.

13. The method according to claim 10, wherein mechanically cooling the second fluid further includes mechanically cooling the second fluid as a function of a temperature of the first fluid or a wet bulb temperature of atmospheric air.

14. The method according to claim 10, further comprising;
sensing a wet bulb temperature of the atmospheric air; and
varying a speed of the compressor compressing the third fluid as a function of the sensed wet bulb temperature to vary the temperature of the second fluid.

15. The method according to claim 10, further comprising;
receiving the free-cooled first fluid in a fluid receiver;
sensing a liquid level of the first fluid contained in the fluid receiver;
mechanically cooling the first fluid to condense the first fluid when the sensed liquid level falls below a first predetermined liquid level; and
deactivating mechanical cooling when the sensed liquid level reaches a second predetermined liquid level higher than the first predetermined liquid level.

16. The method according to claim 15, wherein mechanically cooling the first fluid includes:
cooling the first fluid in the fluid receiver by enabling heat transfer from the first fluid in the fluid receiver to a third fluid;
compressing the third fluid;
condensing the compressed third fluid by enabling heat transfer from the compressed third fluid to the second fluid that has been cooled using atmospheric air; and
reducing a pressure of the condensed third fluid to reduce the temperature of the third fluid.

17. The method according to claim 10, wherein the first fluid and the third fluid contain a refrigerant and the second fluid contains water.

18. The method according to claim 17, wherein the refrigerant is R134A and the second fluid is condenser water, chilled water, or a glycol solution.

19. The method according to claim 18, further comprising:
sensing a temperature of the free-cooled first fluid; and
regulating a flow rate of the second fluid as a function of the temperature of the free-cooled first fluid.

20. A method of cooling data center equipment, the method comprising:
cooling electronic equipment using a first fluid;
free cooling a second fluid that is in thermal communication with the first fluid;
mechanically cooling the second fluid using a third fluid as function of a wet bulb temperature;
diverting a portion of the first fluid flowing to the electronic equipment to cool an inverter of a variable frequency drive for driving a compressor for compressing the third fluid; and
returning the portion of the first fluid cooling the inverter of the variable frequency drive to the first fluid flowing from the electronic equipment.

* * * * *